US010306801B2

(12) United States Patent
Chainer et al.

(10) Patent No.: US 10,306,801 B2
(45) Date of Patent: *May 28, 2019

(54) COLD PLATE DEVICE FOR A TWO-PHASE COOLING SYSTEM

(71) Applicant: International Business Machines Corporation, Armonk, NY (US)

(72) Inventors: Timothy Joseph Chainer, Putnam Valley, NY (US); Pritish Ranjan Parida, Stamford, CT (US); Fanghao Yang, Somerset, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/939,777

(22) Filed: Mar. 29, 2018

(65) Prior Publication Data
US 2018/0228051 A1 Aug. 9, 2018

Related U.S. Application Data

(63) Continuation of application No. 15/411,484, filed on Jan. 20, 2017, now Pat. No. 10,085,362, which is a
(Continued)

(51) Int. Cl.
*H05K 7/20* (2006.01)
*H01L 23/473* (2006.01)
(Continued)

(52) U.S. Cl.
CPC .......... *H05K 7/20254* (2013.01); *F28F 3/12* (2013.01); *H01L 21/4882* (2013.01); *H01L 23/473* (2013.01); *H05K 7/20272* (2013.01)

(58) Field of Classification Search
CPC . H01L 23/473; H01L 21/4882; H01L 23/427; H01L 23/4735; F28F 3/12;
(Continued)

(56) References Cited

U.S. PATENT DOCUMENTS 4,765,397 A 8/1988 Chrysler et al.
4,953,634 A 9/1990 Nelson et al.
(Continued)

FOREIGN PATENT DOCUMENTS

WO 2011149868 A1 12/2011

OTHER PUBLICATIONS

Marcinichen, et al., "Cooling of microprocessors with microevaporation: A novel two-phase cooling cycle," International Journal of Refrigeration, 2010, pp. 1264-1276.
(Continued)

*Primary Examiner* — Adam B Dravininkas
(74) *Attorney, Agent, or Firm* — Amin, Turocy & Watson, LLP

(57) ABSTRACT

Techniques that facilitate two-phase liquid cooling of an electronic device are provided. In one example, an apparatus, such as a cold plate device, comprises a first stackable layer and a second stackable layer. The first stackable layer comprises a first channel formed within the first stackable layer. The first channel comprises a first channel width and the first channel receives a coolant fluid via an inlet port of the apparatus. The second stackable layer comprises a second channel that provides a path for the coolant fluid to flow between the first channel and an outlet port of the apparatus. A width of the second channel increases along a flow direction of the coolant fluid that flows between the inlet port and the outlet port.

11 Claims, 25 Drawing Sheets

Related U.S. Application Data continuation-in-part of application No. 15/281,336, filed on Sep. 30, 2016, now Pat. No. 10,136,550.

(51) Int. Cl.
*H01L 21/48* (2006.01)
*F28F 3/12* (2006.01)

(58) Field of Classification Search
CPC .... F28F 2260/02; F28F 3/02; H05K 7/20254; H05K 7/20772; H05K 7/20281; H05K 7/20263; H05K 7/2039; H05K 7/20927; H05K 13/00
See application file for complete search history.

(56) References Cited

U.S. PATENT DOCUMENTS

| | | | |
|---|---|---|---|
| 5,072,787 A | | 12/1991 | Nakamichi |
| 5,239,200 A | * | 8/1993 | Messina ............... H01L 23/473 165/104.33 |
| 6,253,835 B1 | | 7/2001 | Chu et al. |
| 6,446,442 B1 | * | 9/2002 | Batchelor ............... F25B 21/02 62/259.2 |
| 6,587,336 B2 | | 7/2003 | Chu et al. |
| 6,634,421 B2 | | 10/2003 | Ognibene et al. |
| 6,996,996 B1 | | 2/2006 | Cader |
| 7,086,455 B1 | | 8/2006 | Tilton et al. |
| 7,104,312 B2 | | 9/2006 | Goodson et al. |
| 7,306,028 B2 | | 12/2007 | Zuo et al. |
| 8,077,460 B1 | * | 12/2011 | Dede .......................... F28F 3/12 165/104.33 |
| 8,464,781 B2 | | 6/2013 | Kenny et al. |
| 8,479,806 B2 | | 7/2013 | Qu |
| 8,797,741 B2 | | 8/2014 | Altman |
| 8,833,435 B2 | | 9/2014 | Determan et al. |
| 2001/0035285 A1 | | 11/2001 | Ognibene et al. |
| 2002/0192531 A1 | | 12/2002 | Zimmerman et al. |
| 2004/0067414 A1 | * | 4/2004 | Wei ....................... F28D 9/0043 429/166 |
| 2005/0133212 A1 | | 6/2005 | Wilson et al. |
| 2005/0139996 A1 | | 6/2005 | Myers et al. |
| 2005/0151244 A1 | * | 7/2005 | Chrysler ............... H01L 23/473 257/713 |
| 2006/0002088 A1 | * | 1/2006 | Bezama .................... F28F 3/04 361/702 |
| 2006/0162365 A1 | | 7/2006 | Hoang et al. |
| 2006/0250773 A1 | | 11/2006 | Campbell et al. |
| 2008/0123297 A1 | | 5/2008 | Tilton et al. |
| 2009/0032937 A1 | | 2/2009 | Mann et al. |
| 2010/0012294 A1 | * | 1/2010 | Bezama .................... F28F 3/12 165/80.4 |
| 2010/0172091 A1 | * | 7/2010 | Nishiura ............. H01L 23/3735 361/689 |
| 2011/0079376 A1 | | 4/2011 | Loong et al. |
| 2011/0232882 A1 | | 9/2011 | Zaffetti |
| 2011/0232887 A1 | | 9/2011 | Zaffetti et al. |
| 2012/0170222 A1 | | 7/2012 | Dede et al. |
| 2012/0181005 A1 | | 7/2012 | Downing |
| 2012/0212907 A1 | * | 8/2012 | Dede ................... H01L 23/4735 361/702 |
| 2013/0148305 A1 | | 6/2013 | Ankireddi et al. |
| 2014/0071628 A1 | | 3/2014 | Brunschwiler et al. |
| 2014/0262186 A1 | * | 9/2014 | Kandlikar ............... F28F 13/08 165/177 |
| 2015/0107801 A1 | | 4/2015 | Campbell et al. |
| 2015/0168086 A1 | | 6/2015 | Knowles et al. |
| 2015/0357260 A1 | | 12/2015 | Ankireddi et al. |
| 2016/0036104 A1 | | 2/2016 | Kenney et al. |
| 2016/0293516 A1 | | 10/2016 | Provenziani |
| 2017/0092565 A1 | | 3/2017 | Chen et al. |

OTHER PUBLICATIONS

Krishnan, et al., "A novel hybrid heat sink using phase change materials for transient thermal management of electronics," IEEE Transactions on Components and Packaging Technologies (vol. 28, Issue: 2), May 23, 2005, 2 pages.

Sung, et al., "Single-phase and two-phase cooling using hybrid micro-channel/slot-jet module," International Journal of Heat and Mass Transfer 51 (2008), pp. 3825-3839.

Non-Final Office Action received for U.S. Appl. No. 15/939,797 dated Jan. 10, 2019, 44 pages.

Non-Final Office Action received for U.S. Appl. No. 15/940,088 dated Jan. 10, 2019, 46 pages.

\* cited by examiner

COLD PLATE DEVICE FOR A TWO-PHASE COOLING SYSTEM

STATEMENT REGARDING FEDERALLY SPONSORED RESEARCH OR DEVELOPMENT

This invention was made with Government support under Contract No.: FA8650-14-C-7466 awarded by Defense Advanced Research Projects Agency (DARPA). The Government has certain rights to this invention.

BACKGROUND

The subject disclosure relates to liquid cooling systems, and more specifically, to two-phase cooling systems for electronics.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, methods, apparatuses and/or devices that facilitate two-phase cooling of an electronic device are described.

According to an embodiment, an apparatus can comprise a first stackable layer and a second stackable layer. The first stackable layer can comprise a first channel formed within the first stackable layer. The first channel can comprise a first channel width. Furthermore, the first channel can receive a coolant fluid via an inlet port of the apparatus. The second stackable layer can comprise a second channel that provides a path for the coolant fluid to flow between the first channel and an outlet port of the apparatus. A width of the second channel can increase along a flow direction of the coolant fluid that flows between the inlet port and the outlet port.

According to another embodiment, a method is provided. The method can comprise receiving coolant fluid via an inlet port of a cold plate device coupled to an electronic device. The method can also comprise facilitating flow of the coolant fluid through the cold plate device based on a set of expanding channels in the cold plate device. A width of the set of expanding channels can increase along a flow direction of the coolant fluid through the cold plate device. Additionally, the method can comprise facilitating flow of the coolant fluid from the cold plate device via an outlet port of the cold plate device. The outlet port can receive the coolant fluid from the set of expanding channels.

According to yet another embodiment, a cold plate device can comprise a first stackable layer and a second stackable layer. The first stackable layer can comprise a first channel formed within the first stackable layer. The first channel can receive a coolant fluid via an inlet port of the cold plate device. The second stackable layer can comprise a second channel formed within the second stackable layer. The first channel and the second channel can form a set of expanding channels. Furthermore, a width of the set of expanding channels can increase along a path for the coolant fluid to flow between the inlet port and an outlet port of the cold plate device.

DETAILED DESCRIPTION

Figure 1:
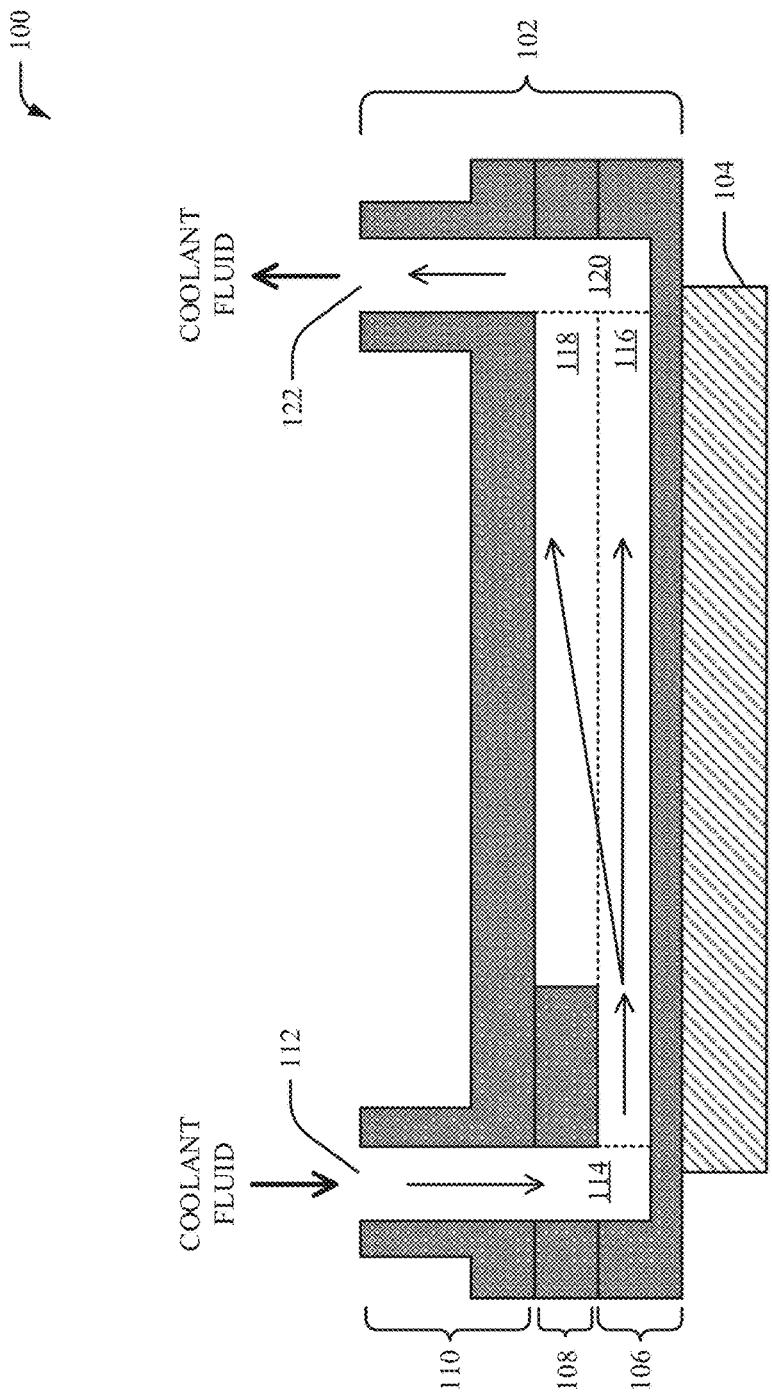
FIG. 1 illustrates a block diagram of an example, non-limiting system associated with a cold plate device and an electronic device in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

A liquid cooling system can be employed to maintain a temperature of an electronic device within a certain temperature range and/or to reduce a temperature of the electronic device. For example, a liquid coolant (e.g., coolant fluid) can be passed through a cold plate that is coupled to an electronic device. One type of liquid cooling system is two-phase liquid cooling. Two-phase liquid cooling can include a pumped two-phase cooling loop in which liquid coolant (e.g., coolant fluid) can enter the cold plate as single phase liquid. The liquid coolant can undergo boiling as the liquid coolant flows through the cold plate. For example, the liquid coolant can boil and evaporate inside the cold plate. Heat generated from the electronic device can therefore be converted into the latent heat and carried away by vapor flow. The liquid coolant can exit the cold plate as a liquid-vapor mixture (e.g., a two-phase mixture). The liquid-vapor mixture (e.g., two-phase flow of gas and liquid) can be stored in a reservoir and/or can be further employed by the pumped two-phase cooling loop to cool the electronic device coupled to the cold plate. However, flow instabilities can occur with respect to a cold plate employed for two-phase liquid cooling. For example, fluctuation of mass flux associated with the liquid coolant within the cold plate can occur, a fluctuation of pressure drop associated with the liquid coolant within the cold plate can occur, reversal of direction of liquid coolant flow within the cold plate can occur, etc. Furthermore, flow instabilities can result in a dry-out condition within the cold plate where an amount of the liquid coolant within the cold plate is below a certain level. As such, performance of the electronic device can be reduced and/or damage to the electronic device (e.g., failure of the electronic device) can occur. Moreover, two-phase liquid cooling systems are generally inefficient.

Embodiments described herein include systems, methods, apparatuses and devices that facilitate two-phase liquid cooling of an electronic device. For example, a novel cold plate device can be coupleable to an electronic device to facilitate thermal management of the electronic device. The cold plate device can include a set of expanding channels that facilitate flow of coolant fluid through the cold plate device. A height of the set of expanding channels can increase along a flow direction of the coolant fluid through the cold plate device. Therefore, the set of expanding channels can be implemented as a channel structure with an inlet orifice that is smaller than an outlet orifice of the channel structure. The set of expanding channels can also be associated with two or more stackable layers of the cold plate device. For instance, a first expanding channel from the set of expanding channels can be formed within a first stackable layer of the cold plate device, a second expanding channel from the set of expanding channels can be formed within a second stackable layer of the cold plate device, etc. Furthermore, the set of expanding channels can be a set of parallel expanding channels. For example, the first expanding channel can be parallel to the second expanding channel. The coolant fluid can flow between at least the first stackable layer and the second stackable layer via the first expanding channel and the second expanding channel.

In certain embodiments, the cold plate device can include an auxiliary channel and/or a nozzle region to facilitate jet impingement cooling of the electronic device. In one example, a location of the nozzle region can correspond to a particular region of the electronic device that satisfies a defined criterion (e.g., a localized region of heat generated by the electronic device 104). As such, stable flow of coolant fluid through a cold plate device can be provided. Furthermore, thermal management of an electronic device coupled to a cold plate device can be improved, performance of an electronic device coupled to a cold plate device can be improved, and/or damage to an electronic device coupled to a cold plate device can be avoided. For example, a decrease in an amount of pressure drop with respect to a cold plate device can be provided, uniform temperature distribution of a cold plate device can be provided, uniform temperature distribution of an electronic device coupled to a cold plate device can be provided, a temperature of an electronic device coupled to a cold plate device can be reduced and/or a temperature of an electronic device coupled to a cold plate device can be efficiently maintained within a certain range of temperatures. Moreover, efficiency of a two-phase cooling system (e.g., energy efficiency) of a two-phase cooling system that includes a cold plate device and/or an electronic device can be improved.

FIG. 1 illustrates a block diagram of an example, non-limiting system 100 that facilitates two-phase liquid cooling in accordance with one or more embodiments described herein. In various embodiments, the system 100 can be a two-phase liquid cooling system. The system 100 can employ a novel device (e.g., a novel cold plate device) that is highly technical in nature. Further, the system 100 can be employed to solve new problems that arise through advancements in technology, two-phase cooling systems and/or computer architecture, and the like. One or more embodiments of the system 100 can provide technical improvements to a cold plate device and/or a two-phase cooling system by at least stabilizing flow of coolant fluid through a cold plate device, decreasing an amount of pressure drop of a cold plate device, improving thermal management of an electronic device coupled to a cold plate device, reducing a temperature of an electronic device coupled to a cold plate device, and/or improving energy efficiency of a two-phase cooling system.

In the embodiment shown in FIG. 1, the system 100 can include a cold plate device 102 and an electronic device 104. The cold plate device 102 can be a two-phase cold plate device. The cold plate device 102 can also be an apparatus employed to facilitate cooling of the electronic device 104. The cold plate device 102 can include a first stackable layer 106, a second stackable layer 108 and a manifold layer 110. In an alternate embodiment, the second stackable layer 108 and the manifold layer 110 can be combined into a single stackable layer. For example, the second stackable layer 108 can include the manifold layer 110. The first stackable layer 106 can be, for example, base plate layer. The cold plate device 102 shown in FIG. 1 can illustrate a cross-sectional view of the cold plate device 102. In an embodiment, the cold plate device 102 can be formed via a three-dimensional (3D) printing process. For example, the first stackable layer 106, the second stackable layer 108 and/or the manifold layer 110 can be 3D printed.

The cold plate device 102 can be coupleable and/or coupled to the electronic device 104. The electronic device 104 can be an electronic device package (e.g., an electronic chip package). For example, in some embodiments, the electronic device 104 can be a 3D stacked electronic chip. In another example, the electronic device 104 can be a processor core (e.g., a complementary metal oxide semiconductor (CMOS) processor core). The cold plate device 102 can also be employed as a cooling mechanism for the electronic device 104. For instance, the electronic device 104 can be a heat source. The electronic device 104 can typically generate heat in response to being operated (e.g., being in a powered on state) and/or in response to processing data. The heat generated by the electronic device 104 can be generated as a function of properties for the device under test such as, for example, power dissipation properties for the electronic device 104, geometric dimensions for the electronic device 104, structural properties for the electronic device 104, electrical properties for the electronic device 104 or the like. Therefore, heat generated by the electronic device 104 can be dissipated via the cold plate device 102.

In an aspect, coolant fluid (e.g., COOLANT FLUID shown in FIG. 1) can be received by the cold plate device 102 to facilitate dissipation of heat generated by the electronic device 104. For example, the manifold layer 110 can include an inlet port 112 that receives the coolant fluid. The cold plate device 102 can include a set of channels that are formed within the cold plate device 102. The set of channels can receive the coolant fluid. The set of channels can also allow the coolant fluid to flow through the cold plate device 102. Therefore, the manifold layer 110 can be an inlet manifold that receives the coolant fluid and supplies the coolant fluid to the set of channels that are formed within the cold plate device 102. The coolant fluid can be a liquid coolant. In some embodiments, the coolant fluid can be a liquid dielectric coolant. For example, the coolant fluid can be a liquid dielectric coolant such as a refrigerant (e.g., R1234ze, R134a, R245fa, etc.) or another type of liquid dielectric coolant (e.g., ammonia, etc.). In another embodiment, the coolant fluid can be water. In the embodiment shown in FIG. 1, the set of channels can include an inlet channel 114, a first stackable channel 116, a second stackable channel 118 and/or an outlet channel 120. The inlet channel 114 can receive the coolant fluid via the inlet port 112. The inlet channel 114 can be formed within the manifold layer 110, the second stackable layer 108 and the first stackable layer 106. For example, the inlet channel 114 can be a though-hole region that is formed through the manifold layer 110 and the second stackable layer 108. Furthermore, the inlet channel 114 can be formed within a portion of the first stackable layer 106 (e.g., without being a through-hole region). In an aspect, the first stackable layer 106 can include the first stackable channel 116 and the second stackable layer 108 can include the second stackable channel 118. A length of the first stackable channel 116 can be different than a length of the second stackable channel 118. In the embodiment shown in FIG. 1, a length of the first stackable channel 116 can be larger than a length of the second stackable channel 118. However, in an alternate embodiment, a length of the first stackable channel 116 can be smaller than a length of the second stackable channel 118. In an aspect, a solid material region of the second stackable layer 108 can be formed between the inlet channel 114 of the second stackable layer 108 and the second stackable channel 118 of the second stackable layer 108. For example, the solid material region can be a metal region. In another example, the solid material region can be a ceramic region (e.g., an aluminum nitride region, etc.). As such, the first stackable channel 116 and the second stackable channel 118 can form a stepwise channel structure. Furthermore, the first stackable channel 116 and the second stackable channel 118 can be parallel channels (e.g., parallel stackable channels, parallel microchannels) within the cold plate device 102.

The inlet channel 114, the first stackable channel 116, the second stackable channel 118 and the outlet channel 120 can provide one or more paths for the coolant fluid to flow through the cold plate device 102. For instance, the coolant fluid can flow through the inlet channel 114 and into the first stackable channel 116. The coolant fluid can additionally flow through the second stackable channel 118. In an aspect, velocity of the coolant fluid can be reduced when the coolant fluid flows from the first stackable channel 116 into the second stackable channel 118. The coolant fluid can also flow through the outlet channel 120 and an outlet port 122 can provide an outlet for the coolant fluid to exit the cold plate device 102.

In an embodiment, the coolant fluid can be provided to the cold plate device 102 via a two-phase liquid cooling system. The two-phase liquid cooling system can be, for example, a pumped two-phase cooling loop that provides the coolant fluid to the cold plate device 102. The coolant fluid can be employed by the cold plate device 102 to reduce a temperature of the electronic device 104 and/or to offset the heat generated by the electronic device 104 in various embodiments. The coolant fluid provided to the cold plate device 102 can be transformed into a liquid-vapor mixture (e.g., a two-phase mixture) as the liquid coolant flows through the set of channels (e.g., the inlet channel 114, the first stackable channel 116, the second stackable channel 118 and the outlet channel 120) included in the cold plate device 102. The first stackable channel 116 and the second stackable channel 118 can be implemented as a set of parallel expanding channels (e.g., a set of parallel microchannels) to stabilize flow of the coolant fluid through the cold plate device 102, to decrease pressure drop of the cold plate device 102, to reduce a temperature of the electronic device 104, and/or to improve energy efficiency of a two-phase cooling system that includes the cold plate device 102 and/or the electronic device 104. Along a flow direction of the coolant fluid, a height of the set of parallel expanding channels can increase. For example, along a flow direction of the coolant fluid, a cross-sectional area of the set of parallel expanding channels can expand in a vertical direction of the cold plate device 102. The set of parallel expanding channels can also be a channel structure where an inlet orifice of the channel structure (e.g., an inlet orifice associated with the inlet channel 114 and the first stackable channel 116) can be smaller than an outlet orifice of the channel structure (e.g., an outlet orifice associated with the first stackable channel 116, the second stackable channel 118 and the outlet channel 120). As a result, an area of flow for the coolant fluid can increase within the cold plate device 102.

Figure 2:
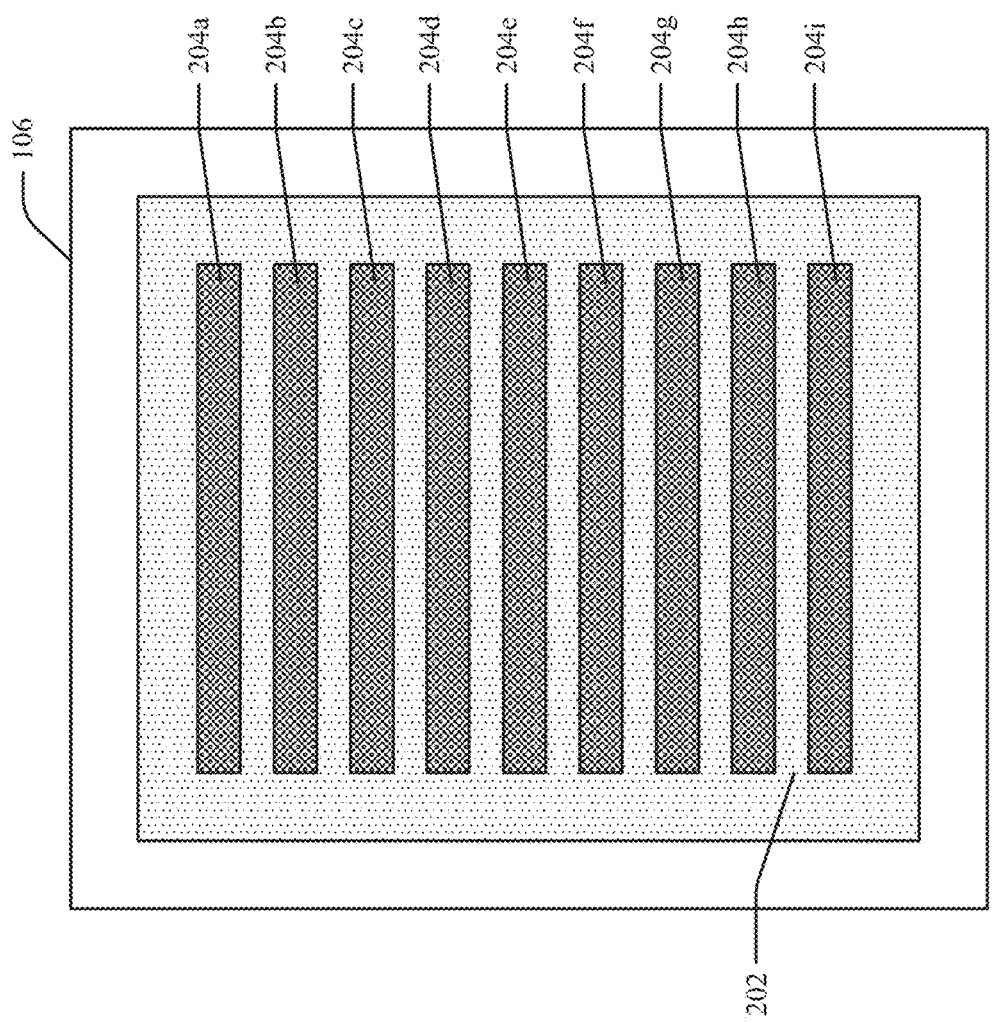
FIG. 2 illustrates an example, non-limiting stackable layer in accordance with one or more embodiments described herein.

FIG. 2 illustrates a top view of an example, non-limiting first stackable layer 106 in accordance with one or more embodiments described herein. Repetitive description of like elements employed in other embodiments described herein is omitted for sake of brevity.

The first stackable layer 106 can be, for example, a base plate layer of the cold plate device 102. In the embodiment shown in FIG. 2, the first stackable layer 106 can include a channel 202 and a set of wall structures 204a, 204b, 204c, 204d, 204e, 204f, 204g, 204h, 204i. The first stackable layer 106 can comprise metal such as copper, aluminum or another type of alloy. Alternatively, the first stackable layer 106 can comprise a ceramic material (e.g., aluminum nitride, etc.). The first stackable channel 116 can be associated with the channel 202. For example, at least a portion of the channel 202 can comprise the first stackable channel 116. The channel 202 can be formed in the first stackable layer 106. In one example, the channel 202 can be formed in the first stackable layer 106 via an etching process (e.g., a chemical etching process). In another example, the channel 202 can be formed in the first stackable layer 106 via a machining fabrication process. In yet another example, the channel 202 can be formed in the first stackable layer 106 via a punching fabrication process (e.g., a punching metal forming process). The set of wall structures 204a, 204b, 204c, 204d, 204e, 204f, 204g, 204h, 204i can be raised structures associated with the channel 202. For example, a height of a wall structure from the set of wall structures 204a, 204b, 204c, 204d, 204e, 204f, 204g, 204h, 204i can correspond to a depth of the channel 202. The set of wall structures 204a, 204b, 204c, 204d, 204e, 204f, 204g, 204h, 204i can also be surrounded by the channel 202. For example, the set of wall structures 204a, 204b, 204c, 204d, 204e, 204f, 204g, 204h, 204i can be formed within an area that corresponds to the channel 202.

Figure 3:
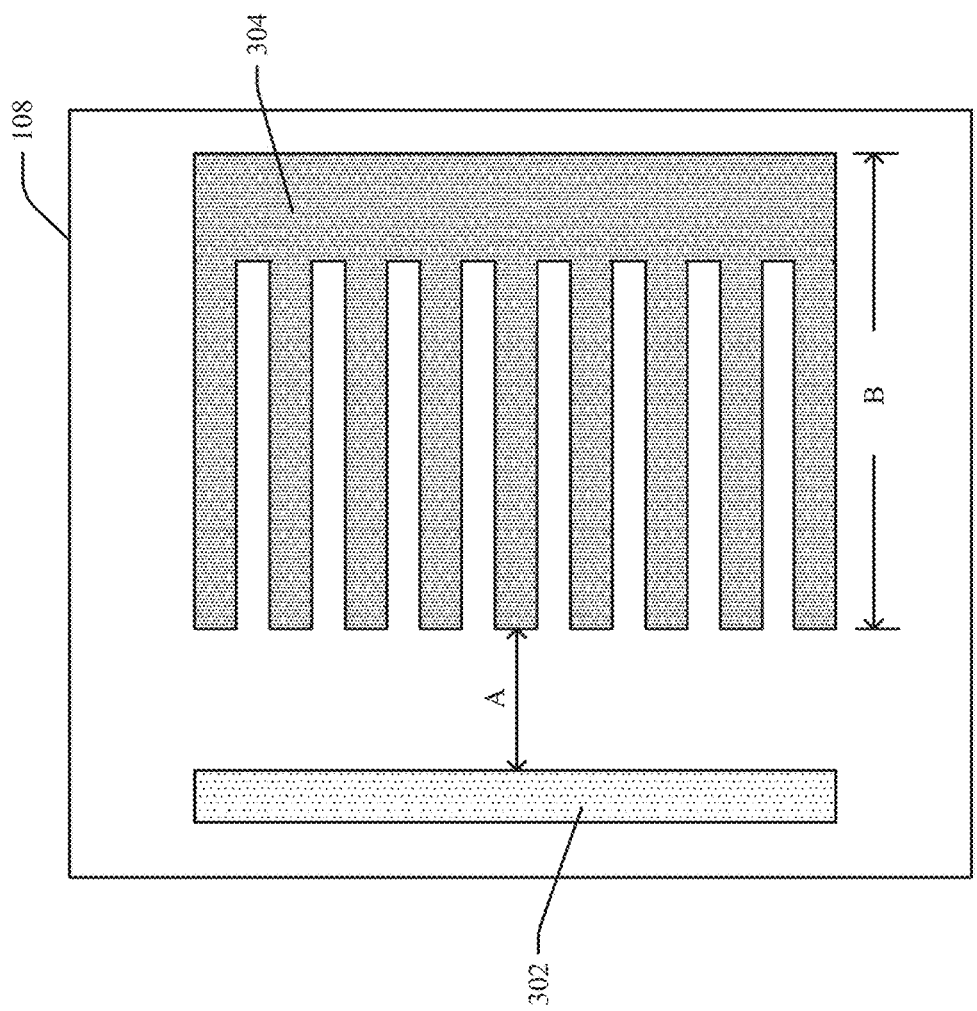
FIG. 3 illustrates another example, non-limiting stackable layer in accordance with one or more embodiments described herein.

FIG. 3 illustrates a top view of an example, non-limiting second stackable layer 108 in accordance with one or more embodiments described herein. Repetitive description of like elements employed in other embodiments described herein is omitted for sake of brevity.

In the embodiment shown in FIG. 3, the second stackable layer 108 can include a through-hole region 302 and a patterned through-hole region 304. The second stackable layer 108 can comprise metal such as copper, aluminum or another type of alloy. Alternatively, the second stackable layer 108 can comprise a ceramic material (e.g., aluminum nitride, etc.). The through-hole region 302 can be a hole through the second stackable layer 108. In one example, the through-hole region 302 can be a rectangular shape or a square shape. However, it is to be appreciated that the through-hole region 302 can comprise a different shape such as a circular shape, another type of shape, etc. The patterned through-hole region 304 can also be a hole through the second stackable layer 108. For instance, the patterned through-hole region 304 can provide a path for the coolant fluid to flow between the first stackable channel 116 and the second stackable channel 118. A shape of the patterned through-hole region 304 can be associated with the channel 202 of the first stackable layer 106 and/or the set of wall structures 204a, 204b, 204c, 204d, 204e, 204f, 204g, 204h, 204i of the first stackable layer 106.

The through-hole region 302 can provide a path for the coolant fluid to flow between the inlet port 112 and the channel 202 of the first stackable layer 106 (e.g., the first stackable channel 116 of the first stackable layer 106). For example, at least a portion of the inlet channel 114 can comprise the through-hole region 302. The patterned through-hole region 304 can provide another path for the coolant fluid to flow between the inlet channel 114 (e.g., a portion of the inlet channel 114 associated with the through-hole region 302) and the outlet channel 120. For example, at least a portion of the patterned through-hole region 304 can correspond to the first stackable channel 116 and the second stackable channel 118. A size of the patterned through-hole region 304 can be determined based at least on a step length A of the second stackable layer 108. For instance, the step length A can correspond to a distance between the through-hole region 302 and at least a portion of the patterned through-hole region 304. The step length A can also be solid material portion (e.g., a metal portion or a ceramic portion) of the second stackable layer 108. For example, the step length A can form a solid material region between the through-hole region 302 and the patterned through-hole region 304. The size of the through-hole region 302 can additionally be determined based on a channel length B of the patterned through-hole region 304. The channel length B of the patterned through-hole region 304 can correspond to a length of the second stackable channel 118 of the second stackable layer 108.

Figure 4:
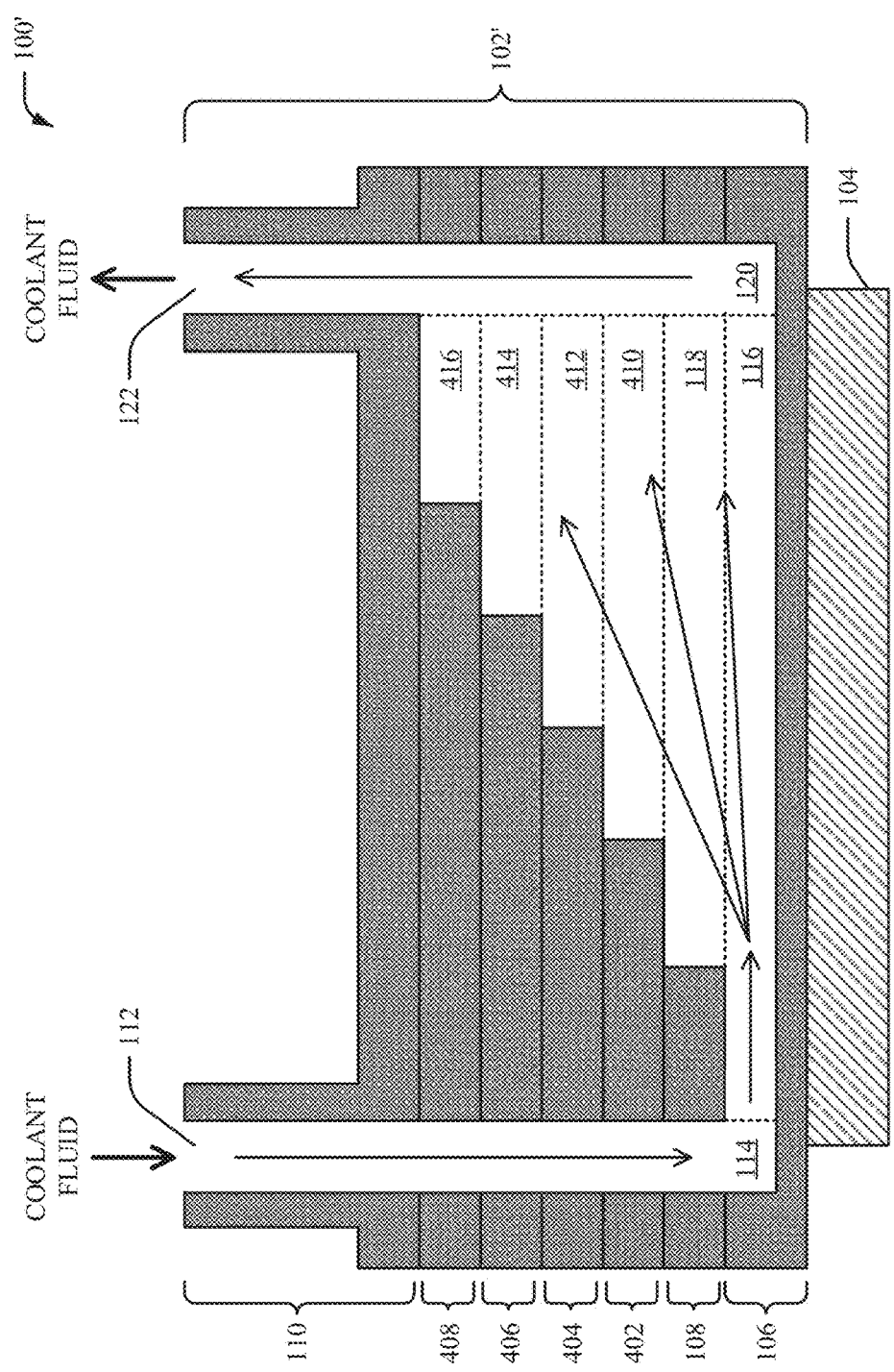
FIG. 4 illustrates a block diagram of another example, non-limiting system associated with a cold plate device and an electronic device in accordance with one or more embodiments described herein.

FIG. 4 illustrates a block diagram of an example, non-limiting system 100' in accordance with one or more embodiments described herein. The system 100' can be an alternate embodiment of the system 100. Repetitive description of like elements employed in other embodiments described herein is omitted for sake of brevity.

In the embodiment shown in FIG. 4, the system 100' can include a cold plate device 102' and the electronic device 104. The cold plate device 102' can be an alternate embodiment of the cold plate device 102. The cold plate device 102' can include the first stackable layer 106, the second stackable layer 108, a third stackable layer 402, a fourth stackable layer 404, a fifth stackable layer 406, a sixth stackable layer 408 and the manifold layer 110. In an alternate embodiment, the sixth stackable layer 408 and the manifold layer 110 can be combined into a single stackable layer. For example, the sixth stackable layer 408 can include the manifold layer 110. In an embodiment, the cold plate device 102' can be formed via a 3D printing process. For example, the first stackable layer 106, the second stackable layer 108, the third stackable layer 402, the fourth stackable layer 404, the fifth stackable layer 406, the sixth stackable layer 408 and/or the manifold layer 110 can be 3D printed.

In an aspect, the coolant fluid can be received by the cold plate device 102' to facilitate dissipation of heat generated by the electronic device 104. The set of channels for the cold plate device 102' in the embodiment shown in FIG. 4 can include the inlet channel 114, the first stackable channel 116, the second stackable channel 118, a third stackable channel 410, a fourth stackable channel 412, a fifth stackable channel 414, a sixth stackable channel 416 and the outlet channel

120. The inlet channel 114 can receive the coolant fluid via the inlet port 112. The inlet channel 114 can be formed within the manifold layer 110, the sixth stackable layer 408, the fifth stackable layer 406, the fourth stackable layer 404, the third stackable layer 402, the second stackable layer 108 and the first stackable layer 106. For example, the inlet channel 114 can be a though-hole region that is formed through the manifold layer 110, the sixth stackable layer 408, the fifth stackable layer 406, the fourth stackable layer 404, the third stackable layer 402 and the second stackable layer 108. Furthermore, the inlet channel 114 can be formed within a portion of the first stackable layer 106 (e.g., without being a through-hole region). In an aspect, the first stackable layer 106 can include the first stackable channel 116, the second stackable layer 108 can include the second stackable channel 118, the third stackable layer 402 can include the third stackable channel 410, the fourth stackable layer 404 can include the fourth stackable channel 412, the fifth stackable layer 406 can include the fifth stackable channel 414, and the sixth stackable layer 408 can include the sixth stackable channel 416.

The first stackable channel 116, the second stackable channel 118, the third stackable channel 410, the fourth stackable channel 412, the fifth stackable channel 414, and the sixth stackable channel 416 can comprise different lengths. For example, a length of the first stackable channel 116 can be different than a length of the second stackable channel 118, the third stackable channel 410, the fourth stackable channel 412, the fifth stackable channel 414, and the sixth stackable channel 416. Furthermore, a length of the second stackable channel 118 can be different than a length of the first stackable channel 116, the third stackable channel 410, the fourth stackable channel 412, the fifth stackable channel 414, and the sixth stackable channel 416. A length of the third stackable channel 410 can also be different than a length of the first stackable channel 116, the second stackable channel 118, the fourth stackable channel 412, the fifth stackable channel 414, and the sixth stackable channel 416. Moreover, a length of the fourth stackable channel 412 can be different than a length of the first stackable channel 116, the second stackable channel 118, the third stackable channel 410, the fifth stackable channel 414, and the sixth stackable channel 416. Also, a length of the fifth stackable channel 414 can be different than a length of the first stackable channel 116, the second stackable channel 118, the third stackable channel 410, the fourth stackable channel 412, and the sixth stackable channel 416. A length of the sixth stackable channel 416 can be different than a length of the first stackable channel 116, the second stackable channel 118, the third stackable channel 410, the fourth stackable channel 412, and the fifth stackable channel 414.

In the embodiment shown in FIG. 4, a length of the first stackable channel 116 can be larger than a length of the second stackable channel 118, the third stackable channel 410, the fourth stackable channel 412, the fifth stackable channel 414, and the sixth stackable channel 416. Furthermore, a length of the second stackable channel 118 can be shorter that a length of the first stackable channel 116, but longer than a length of the third stackable channel 410, the fourth stackable channel 412, the fifth stackable channel 414, and the sixth stackable channel 416. A length of the third stackable channel 410 can also be shorter than a length of the first stackable channel 116 and the second stackable channel 118, but longer than a length of the fourth stackable channel 412, the fifth stackable channel 414, and the sixth stackable channel 416. Moreover, a length of the fourth stackable channel 412 can be shorter than a length of the first stackable channel 116, the second stackable channel 118 and the third stackable channel 410, but longer than a length of the fifth stackable channel 414, and the sixth stackable channel 416. Also, a length of the fifth stackable channel 414 can be shorter than a length of the first stackable channel 116, the second stackable channel 118, the third stackable channel 410 and the fourth stackable channel 412, but longer than a length of the sixth stackable channel 416. A length of the sixth stackable channel 416 can be shorter than a length of the first stackable channel 116, the second stackable channel 118, the third stackable channel 410, the fourth stackable channel 412, and the fifth stackable channel 414.

In an alternate embodiment, a length of the first stackable channel 116 can be shorter than a length of the second stackable channel 118, the third stackable channel 410, the fourth stackable channel 412, the fifth stackable channel 414, and the sixth stackable channel 416. Furthermore, a length of the second stackable channel 118 can be longer that a length of the first stackable channel 116, but shorter than a length of the third stackable channel 410, the fourth stackable channel 412, the fifth stackable channel 414, and the sixth stackable channel 416. A length of the third stackable channel 410 can also be longer than a length of the first stackable channel 116 and the second stackable channel 118, but shorter than a length of the fourth stackable channel 412, the fifth stackable channel 414, and the sixth stackable channel 416. Moreover, a length of the fourth stackable channel 412 can be longer than a length of the first stackable channel 116, the second stackable channel 118 and the third stackable channel 410, but shorter than a length of the fifth stackable channel 414, and the sixth stackable channel 416. Also, a length of the fifth stackable channel 414 can be longer than a length of the first stackable channel 116, the second stackable channel 118, the third stackable channel 410 and the fourth stackable channel 412, but shorter than a length of the sixth stackable channel 416. A length of the sixth stackable channel 416 can be longer than a length of the first stackable channel 116, the second stackable channel 118, the third stackable channel 410, the fourth stackable channel 412, and the fifth stackable channel 414.

The inlet channel 114, the first stackable channel 116, the second stackable channel 118, the third stackable channel 410, the fourth stackable channel 412, the fifth stackable channel 414, the sixth stackable channel 416 and the outlet channel 120 can provide one or more paths for the coolant fluid to flow through the cold plate device 102'. The coolant fluid can flow through the inlet channel 114 and into the first stackable channel 116. The coolant fluid can additionally flow through the second stackable channel 118, the third stackable channel 410, the fourth stackable channel 412, the fifth stackable channel 414 and/or the sixth stackable channel 416. Moreover, the coolant fluid can flow through the outlet channel 120 and an outlet port 122 can provide an outlet for the coolant fluid to exit the cold plate device 102'. The coolant fluid provided to the cold plate device 102' can be transformed into a liquid-vapor mixture (e.g., a two-phase mixture) as the liquid coolant flows through the set of channels (e.g., the inlet channel 114, the first stackable channel 116, the second stackable channel 118, the third stackable channel 410, the fourth stackable channel 412, the fifth stackable channel 414, the sixth stackable channel 416, and/or the outlet channel 120) included in the cold plate device 102'.

The first stackable channel 116, the second stackable channel 118, the third stackable channel 410, the fourth stackable channel 412, the fifth stackable channel 414 and the sixth stackable channel 416 can be implemented as a set of parallel expanding channels (e.g., a set of parallel microchannels) to at least stabilize flow of the coolant fluid through the cold plate device 102', to decrease pressure drop of the cold plate device 102', to reduce a temperature of the electronic device 104, and/or to improve energy efficiency of a two-phase cooling system. Along a flow direction of the coolant fluid, a height of the set of parallel expanding channels can increase. For example, along a flow direction of the coolant fluid, a cross-sectional area of the set of parallel expanding channels can expand in a vertical direction of the cold plate device 102'. The set of parallel expanding channels can also be a channel structure where an inlet orifice of the channel structure (e.g., an inlet orifice associated with the inlet channel 114 and the first stackable channel 116) can be smaller than an outlet orifice of the channel structure (e.g., an outlet orifice associated with the first stackable channel 116, the second stackable channel 118, the third stackable channel 410, the fourth stackable channel 412, the fifth stackable channel 414, the sixth stackable channel 416 and the outlet channel 120). As a result, an area of flow for the coolant fluid can increase within the cold plate device 102'.

Figure 5:
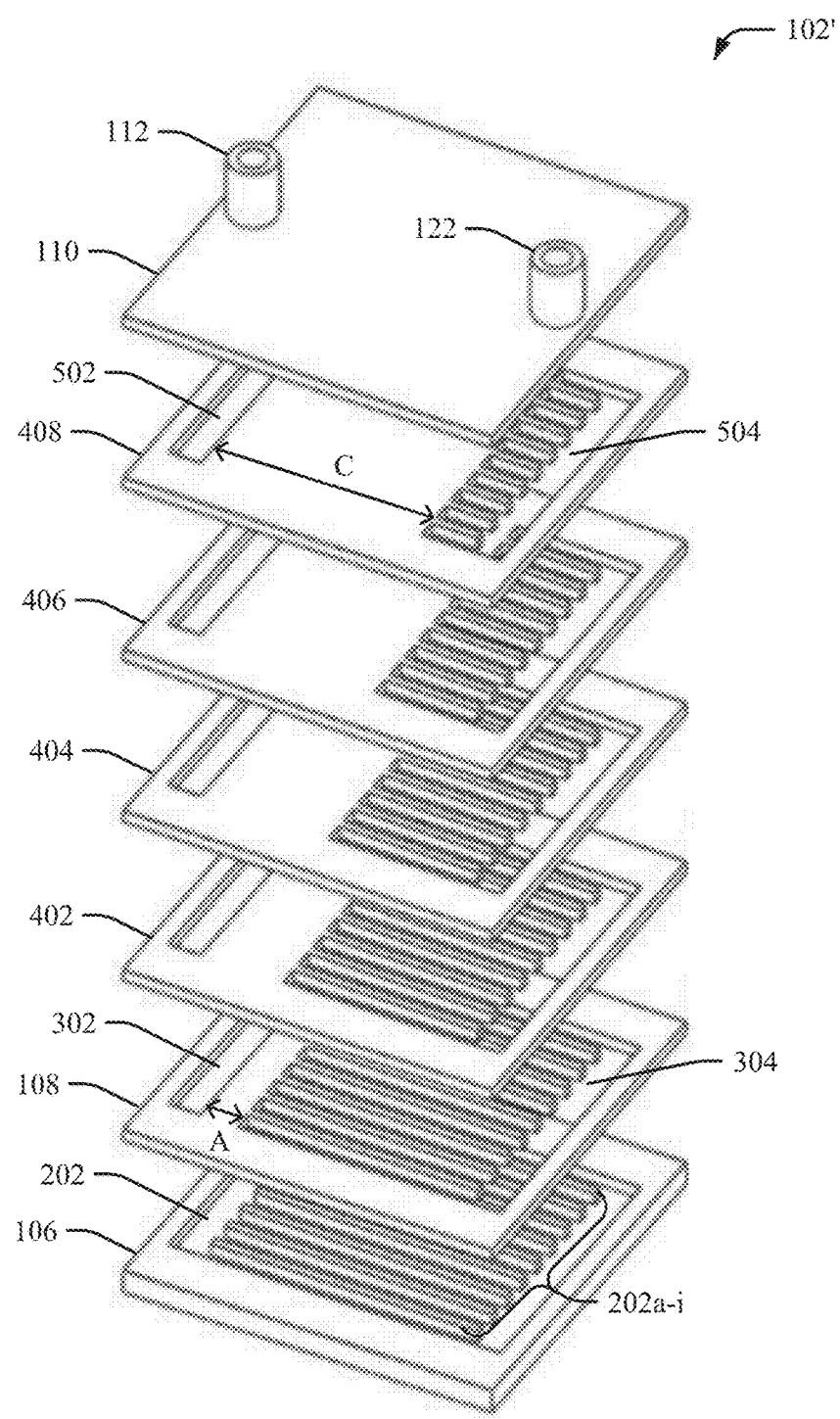
FIG. 5 illustrates an exploded view of an example, non-limiting cold plate device in accordance with one or more embodiments described herein.

FIG. 5 illustrates an exploded view of an example, non-limiting cold plate device 102' associated with the system 100' in accordance with one or more embodiments described herein. Repetitive description of like elements employed in other embodiments described herein is omitted for sake of brevity.

In the embodiment shown in FIG. 5, the cold plate device 102' can include the first stackable layer 106, the second stackable layer 108, the third stackable layer 402, the fourth stackable layer 404, the fifth stackable layer 406, the sixth stackable layer 408 and the manifold layer 110. The manifold layer 110 can include the inlet port 112 and the outlet port 122. In an aspect, the first stackable layer 106 can include the channel 202 and the set of wall structures 204a, 204b, 204c, 204d, 204e, 204f, 204g, 204h, 204i. Furthermore, the second stackable layer 108 can include the through-hole region 302 and the patterned through-hole region 304. It is to be appreciated that the number of stackable layers and/or the number of stackable channels can be varied based on design criteria of a particular implementation. In an aspect, the coolant liquid can enter the cold plate device 102' (e.g., via the inlet port 112) as a single-phase liquid flow. Furthermore, at least a portion of the coolant liquid can evaporate inside the inlet channel 114, the first stackable channel 116, the second stackable channel 118, the third stackable channel 410, the fourth stackable channel 412, the fifth stackable channel 414 and/or the sixth stackable channel 416 and the outlet channel 120. As such, the coolant liquid can exit the cold plate device (e.g., via the outlet port 122) as a liquid-vapor mixture (e.g., a two-phase mixture).

In another aspect, a step length can be different for the first stackable layer 106, the second stackable layer 108, the third stackable layer 402, the fourth stackable layer 404, the fifth stackable layer 406 and/or the sixth stackable layer 408. For instance, a step length C for the sixth stackable layer 408 can be larger than the step length A for the second stackable layer 108 and/or a step length for the third stackable layer 402, the fourth stackable layer 404 and/or the fifth stackable layer 406. In one example, size of a through-hole region 502 of the sixth stackable layer 408 can be determined based at least on the step length C of the sixth stackable layer 408. For example, the step length C can correspond to a distance between the through-hole region 502 and a patterned through-hole region 504 of the sixth stackable layer 408.

Figure 6:
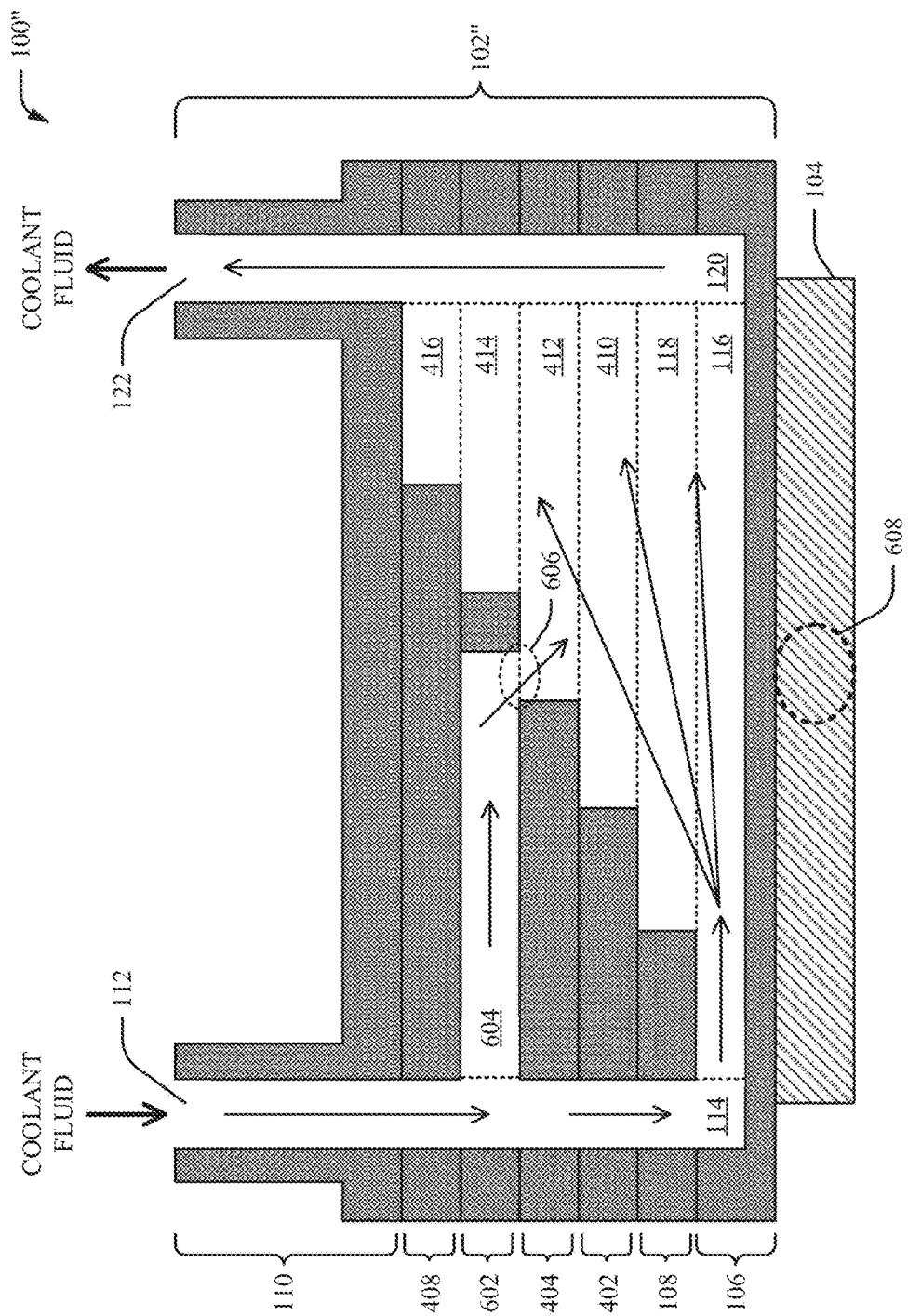
FIG. 6 illustrates a block diagram of yet another example, non-limiting system associated with a cold plate device and an electronic device in accordance with one or more embodiments described herein.

FIG. 6 illustrates a block diagram of an example, non-limiting system 100" in accordance with one or more embodiments described herein. The system 100" can be an alternate embodiment of the system 100 and/or the system 100'. Repetitive description of like elements employed in other embodiments described herein is omitted for sake of brevity.

In the embodiment shown in FIG. 6, the system 100" can include a cold plate device 102" and the electronic device 104. The cold plate device 102" can be an alternate embodiment of the cold plate device 102 and/or the cold plate device 102'. The cold plate device 102" can include the first stackable layer 106, the second stackable layer 108, the third stackable layer 402, the fourth stackable layer 404, a fifth stackable layer 602, the sixth stackable layer 408 and the manifold layer 110. In an alternate embodiment, the sixth stackable layer 408 and the manifold layer 110 can be combined into a single stackable layer. For example, the sixth stackable layer 408 can include the manifold layer 110. In an embodiment, the cold plate device 102" can be formed via a 3D printing process. For example, the first stackable layer 106, the second stackable layer 108, the third stackable layer 402, the fourth stackable layer 404, the fifth stackable layer 602, the sixth stackable layer 408 and/or the manifold layer 110 can be 3D printed.

In an aspect, the coolant fluid can be received by the cold plate device 102" to facilitate dissipation of heat generated by the electronic device 104. The set of channels for the cold plate device 102" in the embodiment shown in FIG. 6 can include the inlet channel 114, an auxiliary channel 604, the first stackable channel 116, the second stackable channel 118, the third stackable channel 410, the fourth stackable channel 412, the fifth stackable channel 414, the sixth stackable channel 416 and/or the outlet channel 120. The inlet channel 114 can receive the coolant fluid via the inlet port 112. The inlet channel 114 can be formed within the manifold layer 110, the sixth stackable layer 408, the fifth stackable layer 602, the fourth stackable layer 404, the third stackable layer 402, the second stackable layer 108 and the first stackable layer 106. For example, the inlet channel 114 can be a though-hole region that is formed through the manifold layer 110, the sixth stackable layer 408, the fifth stackable layer 602, the fourth stackable layer 404, the third stackable layer 402 and the second stackable layer 108. Furthermore, the inlet channel 114 can be formed within a portion of the first stackable layer 106 (e.g., without being a through-hole region). In another aspect, the first stackable layer 106 can include the first stackable channel 116, the second stackable layer 108 can include the second stackable channel 118, the third stackable layer 402 can include the third stackable channel 410, the fourth stackable layer 404 can include the fourth stackable channel 412, the fifth stackable layer 602 can include the auxiliary channel 604 and the fifth stackable channel 414, and the sixth stackable layer 408 can include the sixth stackable channel 416. A solid material region (e.g., a metal region or a ceramic region) of the fifth stackable layer 602 can be formed between the auxiliary channel 604 of the fifth stackable layer 602 and the fifth stackable channel 414 of the fifth stackable layer 602.

The inlet channel 114, the auxiliary channel 604, the first stackable channel 116, the second stackable channel 118, the third stackable channel 410, the fourth stackable channel 412, the fifth stackable channel 414, the sixth stackable channel 416 and the outlet channel 120 can provide one or more paths for the coolant fluid to flow through the cold plate device 102". The auxiliary channel 604 can receive the coolant fluid from the inlet channel 114. The coolant fluid can also flow through the auxiliary channel 604. Furthermore, the coolant fluid can be provided to the first stackable channel 116, the second stackable channel 118, the third stackable channel 410, the fourth stackable channel 412, the fifth stackable channel 414, the sixth stackable channel 416 and/or the outlet channel 120 via the auxiliary channel 604. For example, a nozzle region 606 of the auxiliary channel 604 can provide an opening between at least the fourth stackable channel 412 and the auxiliary channel 604. Additionally, the coolant fluid can flow through the inlet channel 114 and into the first stackable channel 116. The coolant fluid can also flow through the second stackable channel 118, the third stackable channel 410, the fourth stackable channel 412, the fifth stackable channel 414 and/or the sixth stackable channel 416. Moreover, the coolant fluid can flow through the outlet channel 120 and an outlet port 122 can provide an outlet for the coolant fluid to exit the cold plate device 102". The coolant fluid provided to the cold plate device 102" can be transformed into a liquid-vapor mixture (e.g., a two-phase mixture) as the liquid coolant flows through the set of channels (e.g., the inlet channel 114, the auxiliary channel 604, the first stackable channel 116, the second stackable channel 118, the third stackable channel 410, the fourth stackable channel 412, the fifth stackable channel 414, the sixth stackable channel 416, and/or the outlet channel 120) included in the cold plate device 102".

The cold plate device 102" shown in FIG. 6 can be a hybrid cold plate device that provides both stabilized two-phase flow via the set of expanding channels and directed cooling with respect to a hot spot region 608 of the electronic device 104.

In an aspect, a location of the nozzle region 606 can correspond to the hot spot region 608 of the electronic device 104. The nozzle region 606 can facilitate directed heat transfer (e.g., directed cooling) for the hot spot region 608 of the electronic device 104. For example, the nozzle region 606 can be an opening that creates jet impingement and/or spray cooling for the hot spot region 608 of the electronic device 104. The hot spot region 608 can also be a region of the electronic device 104 that satisfies a defined criterion. For example, the hot spot region 608 can be a localized region of heat generated by the electronic device 104. As such, a location of the nozzle region 606 corresponds to the hot spot region 608 of the electronic device 104 that satisfies a defined criterion with respect to an amount of heat generated by the electronic device 104. Furthermore, the hot spot region 608 can enhance thermal management with respect to the hot spot region 608 of the electronic device 104. Additionally, the auxiliary channel 604, the first stackable channel 116, the second stackable channel 118, the third stackable channel 410, the fourth stackable channel 412, the fifth stackable channel 414 and/or the sixth stackable channel 416 can be implemented as a set of hybrid expanding channels to facilitate stabilized two-phase flow throughout the cold plate device 102" and directed cooling with respect to the hot spot region 608 of the electronic device 104.

Figure 7:
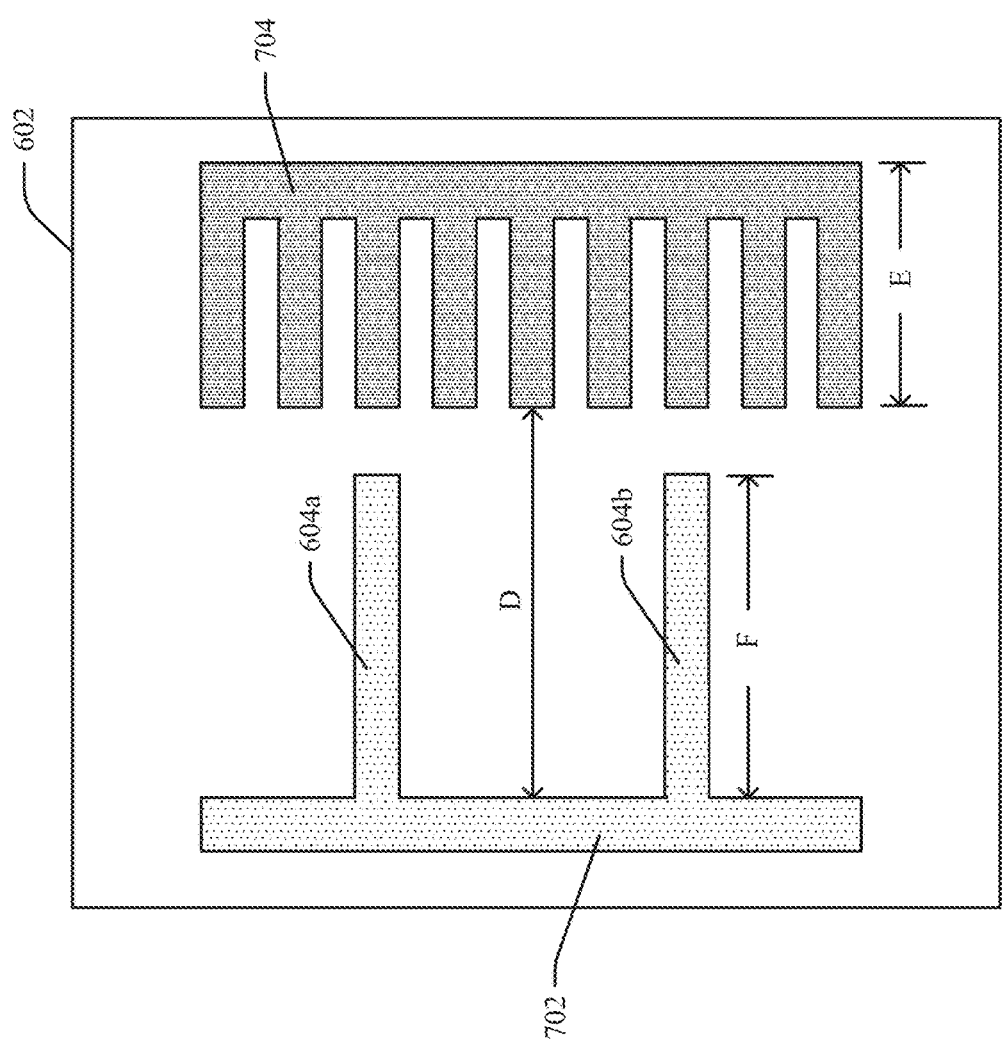
FIG. 7 illustrates yet another example, non-limiting stackable layer in accordance with one or more embodiments described herein.

FIG. 7 illustrates a top view of an example, non-limiting fifth stackable layer 602 in accordance with one or more embodiments described herein. Repetitive description of like elements employed in other embodiments described herein is omitted for sake of brevity.

In the embodiment shown in FIG. 7, the fifth stackable layer 602 can include a through-hole region 702 and a patterned through-hole region 704. The fifth stackable layer 602 can also include an auxiliary channel 604a and an auxiliary channel 604b. The auxiliary channel 604a and/or the auxiliary channel 604b can be associated with the auxiliary channel 604 shown in FIG. 6. For example, at least a portion of the auxiliary channel 604a and/or the auxiliary channel 604b can correspond to the auxiliary channel 604.

The fifth stackable layer 602 can comprise metal such as copper, aluminum or another type of alloy. Alternatively, the fifth stackable layer 602 can comprise a ceramic material (e.g., aluminum nitride, etc.). The through-hole region 702 can be a hole through the fifth stackable layer 602. In one example, the through-hole region 702 can be a rectangular shape or a square shape. However, it is to be appreciated that the through-hole region 702 can comprise a different shape such as a circular shape, another type of shape, etc. The patterned through-hole region 704 can also be a hole through the fifth stackable layer 602. A shape of the patterned through-hole region 704 can be associated with the channel 202 of the first stackable layer 106 and/or the set of wall structures 204a, 204b, 204c, 204d, 204e, 204f, 204g, 204h, 204i of the first stackable layer 106. Furthermore, a size of the patterned through-hole region 704 can be smaller than a size of other patterned through-hole regions associated with other stackable layers (e.g., the patterned through-hole region 304 of the second stackable layer 108).

The through-hole region 702 can provide a path for the coolant fluid to flow between the inlet port 112 and the set of channels for the cold plate device 102". For example, at least a portion of the inlet channel 114 can comprise the through-hole region 702. The patterned through-hole region 704 can provide another path for the coolant fluid to flow between the inlet channel 114 (e.g., a portion of the inlet channel 114 associated with the through-hole region 702) and the outlet channel 120. For instance, at least a portion of the patterned through-hole region 704 can correspond to the first stackable channel 116, the second stackable channel 118, the third stackable channel 410, the fourth stackable channel 412 and/or the sixth stackable channel 416. A size of the patterned through-hole region 704 can be determined based at least on a step length D of the fifth stackable layer 602. For example, the step length D can correspond to a distance between a portion of the through-hole region 702 and the patterned through-hole region 704. The size of the through-hole region 702 can additionally be determined based on a channel length E of the patterned through-hole region 704. The channel length E of the patterned through-hole region 704 can correspond to a length of the fifth stackable channel 414 of the fifth stackable layer 602. Furthermore, a channel length F of the auxiliary channel 604a and/or the auxiliary channel 604b can correspond to a length of the auxiliary channel 604. It is to be appreciated that a number of auxiliary channels for a stackable layer can be varied based a number of hot spot regions and/or a location of hot spot regions of the electronic device 104. For example, a stackable layer can include a single auxiliary channel In another example, a stackable layer can include more than two auxiliary channels.

Figure 8:
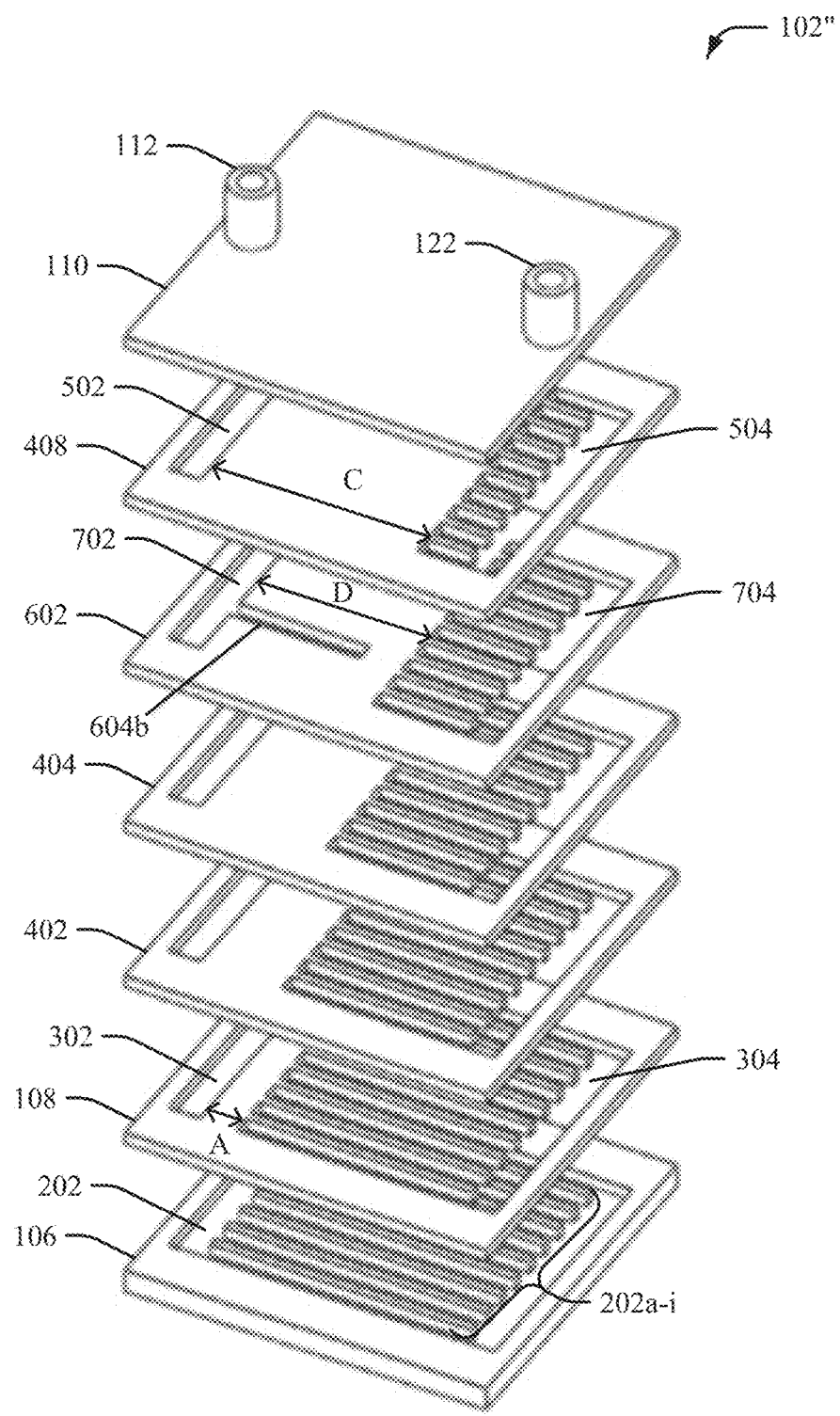
FIG. 8 illustrates an exploded view of another example, non-limiting cold plate device in accordance with one or more embodiments described herein.

FIG. 8 illustrates an exploded view of an example, non-limiting cold plate device 102" associated with the system 100" in accordance with one or more embodiments described herein. Repetitive description of like elements employed in other embodiments described herein is omitted for sake of brevity.

In the embodiment shown in FIG. 8, the cold plate device 102" can include the first stackable layer 106, the second stackable layer 108, the third stackable layer 402, the fourth stackable layer 404, the fifth stackable layer 602, the sixth stackable layer 408 and the manifold layer 110. The manifold layer 110 can include the inlet port 112 and the outlet port 122. In an aspect, the first stackable layer 106 can include the channel 202 and the set of wall structures 204a, 204b, 204c, 204d, 204e, 204f, 204g, 204h, 204i. Furthermore, the second stackable layer 108 can include the through-hole region 302 and the patterned through-hole region 304. It is to be appreciated that the number of stackable layers and/or the number of stackable channels can be varied based on design criteria of a particular implementation. In an aspect, the coolant liquid can enter the cold plate device 102" (e.g., via the inlet port 112) as a single-phase liquid flow. Furthermore, at least a portion of the coolant liquid can evaporate inside the inlet channel 114, the auxiliary channel 604 (e.g., the auxiliary channel 604b), the first stackable channel 116, the second stackable channel 118, the third stackable channel 410, the fourth stackable channel 412, the fifth stackable channel 414 and/or the sixth stackable channel 416 and the outlet channel 120. As such, the coolant liquid can exit the cold plate device (e.g., via the outlet port 122) as a liquid-vapor mixture (e.g., a two-phase mixture).

In another aspect, a step length can be different for the first stackable layer 106, the second stackable layer 108, the third stackable layer 402, the fourth stackable layer 404, the fifth stackable layer 406 and/or the sixth stackable layer 408. For instance, a step length C for the sixth stackable layer 408 can be larger than the step length D for the fifth stackable layer 406, the step length A for the second stackable layer 108, and/or a step length for the third stackable layer 402 and/or the fourth stackable layer 404. In one example, size of the through-hole region 702 of the fifth stackable layer 602 can be determined based at least on the step length D of the fifth stackable layer 602. For example, the step length D can correspond to a distance between the through-hole region 702 and a portion of the patterned through-hole region 704.

Figure 9:
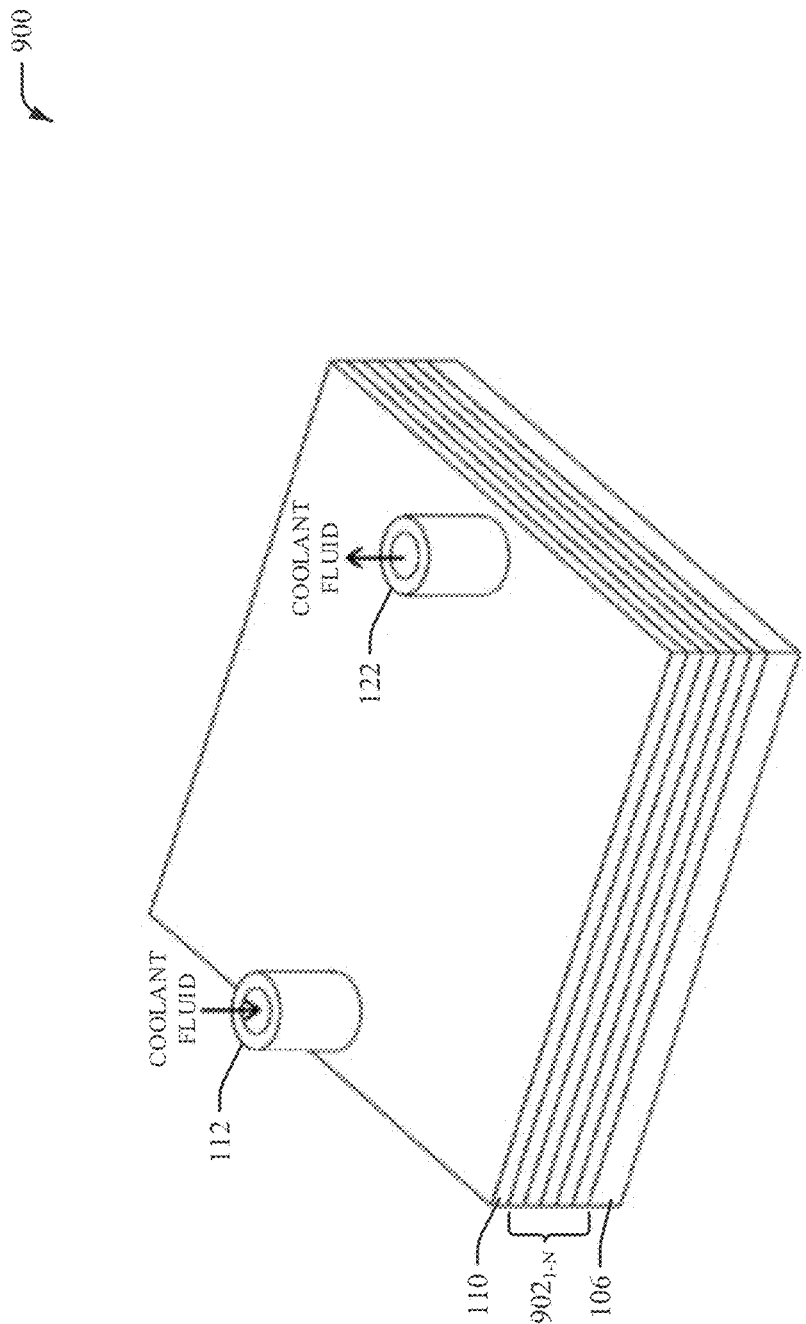
FIG. 9 illustrates a perspective view of an example, non-limiting cold plate device in accordance with one or more embodiments described herein.

FIG. 9 illustrates a perspective view of an example, non-limiting cold plate device 900 in accordance with one or more embodiments described herein. Repetitive description of like elements employed in other embodiments described herein is omitted for sake of brevity.

The cold plate device 900 can correspond to the cold plate device 102, the cold plate device 102' and/or the cold plate device 102". The cold plate device 900 can be stacked with multiple layers. In the embodiment shown in FIG. 9, the cold plate device 900 can include the first stackable layer 106, one or more other stackable layers $902_{1-N}$ and the manifold layer 110. In an embodiment, the cold plate device 900 can be formed via a 3D printing process. For example, the first stackable layer 106, the one or more other stackable layers $902_{1-N}$ and/or the manifold layer 110 can be 3D printed. The one or more other stackable layers $902_{1-N}$ can include, for example, the first stackable layer 106, the second stackable layer 108, the third stackable layer 402, the fourth stackable layer 404, the fifth stackable layer 406, the fifth stackable layer 602 and/or the sixth stackable layer 408. The coolant fluid can enter the cold plate device 900 as liquid coolant via the inlet port 112. Furthermore, the coolant fluid can exit the cold plate device 900 as a mixture of vapor and liquid via the outlet port 122. A stackable layer from the one or more other stackable layers $902_{1-N}$ can be a metal layer (e.g., a metal sheet). Additionally or alternatively, a stackable layer from the one or more stackable layers $902_{1-N}$ can be a ceramic layer. Furthermore, a stackable layer from the one or more other stackable layers $902_{1-N}$ can include one or more through-layer patterns and/or one or more through-holes. For example, a stackable layer from the one or more other stackable layers $902_{1-N}$ can include one or more through-hole regions, one or more patterned through-hole regions and/or or one or more auxiliary channels. In a non-limiting example, the one or more other stackable layers $902_{1-N}$ can include the second stackable layer 108, the third stackable layer 402, the fourth stackable layer 404, the fifth stackable layer 406, the fifth stackable layer 602 and/or the sixth stackable layer 408.

The cold plate device 900 can be assembled via one or more fabrication steps. For example, during a fabrication step, the first stackable layer 106, the one or more other stackable layers $902_{1-N}$ and/or the manifold layer 110 can be stacked. During another fabrication step, the first stackable layer 106, the one or more other stackable layers $902_{1-N}$ and/or the manifold layer 110 can be aligned. During yet another fabrication step, sintering associated with the cold plate device 900 can be performed in response to pressure applied to a surface of the manifold layer and a surface of the first stackable layer 106 (e.g., a top surface of the cold plate device 900 and a bottom surface of the cold plate device 900). Additionally or alternatively, during another fabrication step, welding associated with the cold plate device 900 can be performed in response to pressure applied to a surface of the manifold layer and a surface of the first stackable layer 106 (e.g., a top surface of the cold plate device 900 and a bottom surface of the cold plate device 900).

Figure 10:
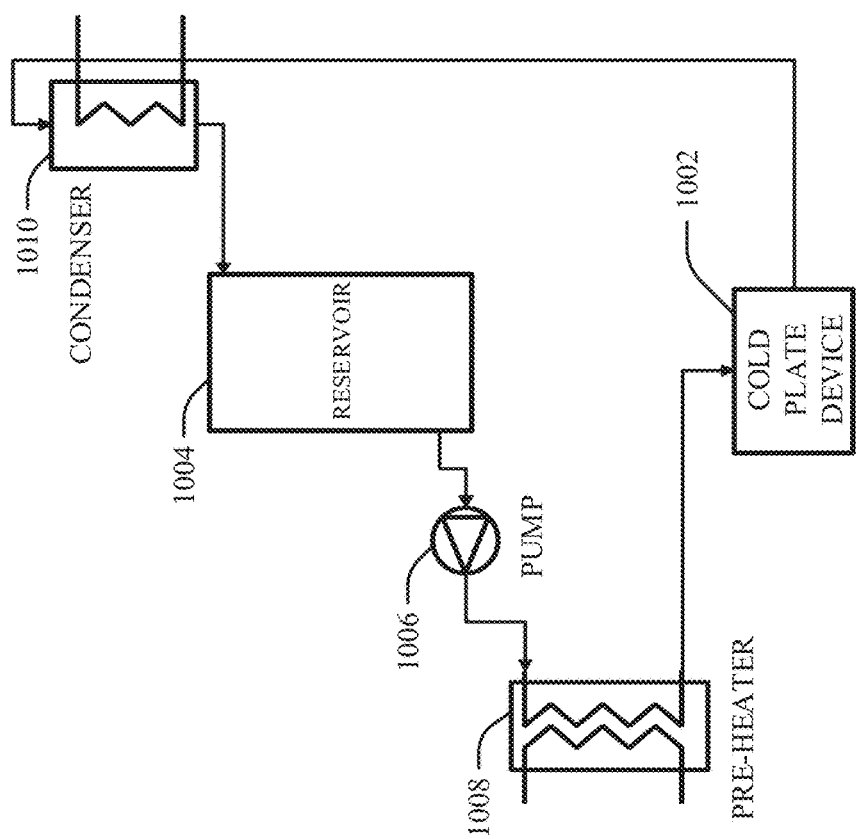
FIG. 10 illustrates a block diagram of an example, non-limiting system that facilitates two-phase cooling of an electronic device in accordance with one or more embodiments described herein.

FIG. 10 illustrates an example, non-limiting system 1000 that facilitates two-phase liquid cooling of an electronic device in accordance with one or more embodiments described herein. Repetitive description of like elements employed in other embodiments described herein is omitted for sake of brevity.

In the embodiment shown in FIG. 10, the system 1000 includes a cold plate device 1002, a reservoir 1004, a pump 1006, a pre-heater 1008, and a condenser 1010. The cold plate device 1002 can correspond to a cold plate device shown and/or described with respect to FIGS. 1-9. For example, the cold plate device 1002 can correspond to the cold plate device 102, the cold plate device 102', the cold plate device 102" and/or the cold plate device 900. In an aspect, the cold plate device 1002 can include the first stackable layer 106, the second stackable layer 108, the third stackable layer 402, the fourth stackable layer 404, the fifth stackable layer 406, the fifth stackable layer 602, the sixth stackable layer 408 and/or the manifold layer 110.

The cold plate device 1002 can comprise a set of channels (e.g., a set of expanding channels, a set of parallel expanding channels, etc.), as more fully disclosed herein. For instance, the cold plate device 1002 can include the inlet channel 114, an auxiliary channel 604, the first stackable channel 116, the second stackable channel 118, the third stackable channel 410, the fourth stackable channel 412, the fifth stackable channel 414, the sixth stackable channel 416 and/or the outlet channel 120. The set of channels for the cold plate device 1002 can be a set of expanding channels where a height of the set of expanding channels increases along a flow direction of the coolant fluid. Therefore, a path for coolant fluid can be provided in the cold plate device 1002 via a novel channel structure. In an aspect, the set of channels of the cold plate device 1002 can include one or more through-hole portions, one or more patterned through-hole portions and/or one or more auxiliary channels.

An electronic device (e.g., the electronic device 104) coupled to the cold plate device 1002 can generate heat in response to being operated and/or processing data. The heat generated by the electronic device (e.g., the electronic device 104) can be generated as a function of the properties for the electronic device (e.g., the electronic device 104).

The reservoir 1004, the pump 1006, the pre-heater 1008, and/or the condenser 1010 can be implemented as a two-phase cooling system for the cold plate device 1002 and/or the electronic device (e.g., the electronic device 104). For example, the reservoir 1004, the pump 1006, the pre-heater 1008, and/or the condenser 1010 can be implemented as a pumped two-phase cooling loop that provides the coolant fluid to the cold plate device 1002. The reservoir 1004 can store the coolant fluid (e.g., liquid coolant). In one example, the coolant fluid stored by the reservoir 1004 can be water. In another example, the coolant fluid stored by the reservoir 1004 can be a refrigerant. In yet another example, the coolant fluid stored by the reservoir 1004 can be a dielectric coolant. The coolant fluid stored by the reservoir 1004 can be provided to the cold plate device 1002. In an implementation, the coolant fluid stored by the reservoir 1004 can be provided to the cold plate device 1002 (e.g., directly to the inlet port 112 of the cold plate device 1002) via a pump 1006. For example, the pump 1006 can pump the coolant fluid from the reservoir 1004 to the cold plate device 1002. However, in another implementation, the pre-heater 1008 can control a temperature of the coolant fluid that is provided to the cold plate device 1002. For example, the pump 1006 can pump the coolant fluid from the reservoir 1004 to the pre-heater 1008 and the pre-heater 1008 can provide the coolant fluid to the cold plate device 1002.

The coolant fluid can enter the cold plate device 1002 as single phase liquid. The coolant fluid provided to the cold plate device 1002 can be employed by the cold plate device 1002 to reduce a temperature of the cold plate device 1002 and/or to offset the heat generated by the cold plate device 1002. The coolant fluid provided to the cold plate device 1002 can be transformed into a liquid-vapor mixture (e.g., a two-phase mixture) as the coolant fluid flows through the cold plate device 1002. For example, the coolant fluid can undergo boiling as the coolant fluid flows through the set of channels within the cold plate device 1002. The coolant fluid can exit the cold plate device 1002 as a liquid-vapor mixture (e.g., a two-phase mixture). The condenser 1010 can condense the vapor exiting from the cold plate device 1002. In certain implementations, the condenser 1010 can transfer heat from the cold plate device 1002 to an external cooling loop (not shown). Liquid from the condenser 1010 can flow into the reservoir 1004. The liquid (e.g., the coolant fluid) from the reservoir 1004 can then be pumped back into the cold plate device 1002 employing the pump 1006. In an alternate embodiment, a filter (not shown) can be implemented between the pump 1006 and the cold plate device 1002 to remove debris or residue from the coolant fluid provided to the cold plate device 1002 and/or to prevent the set of channels of the cold plate device 1002 from clogging.

Figure 11:
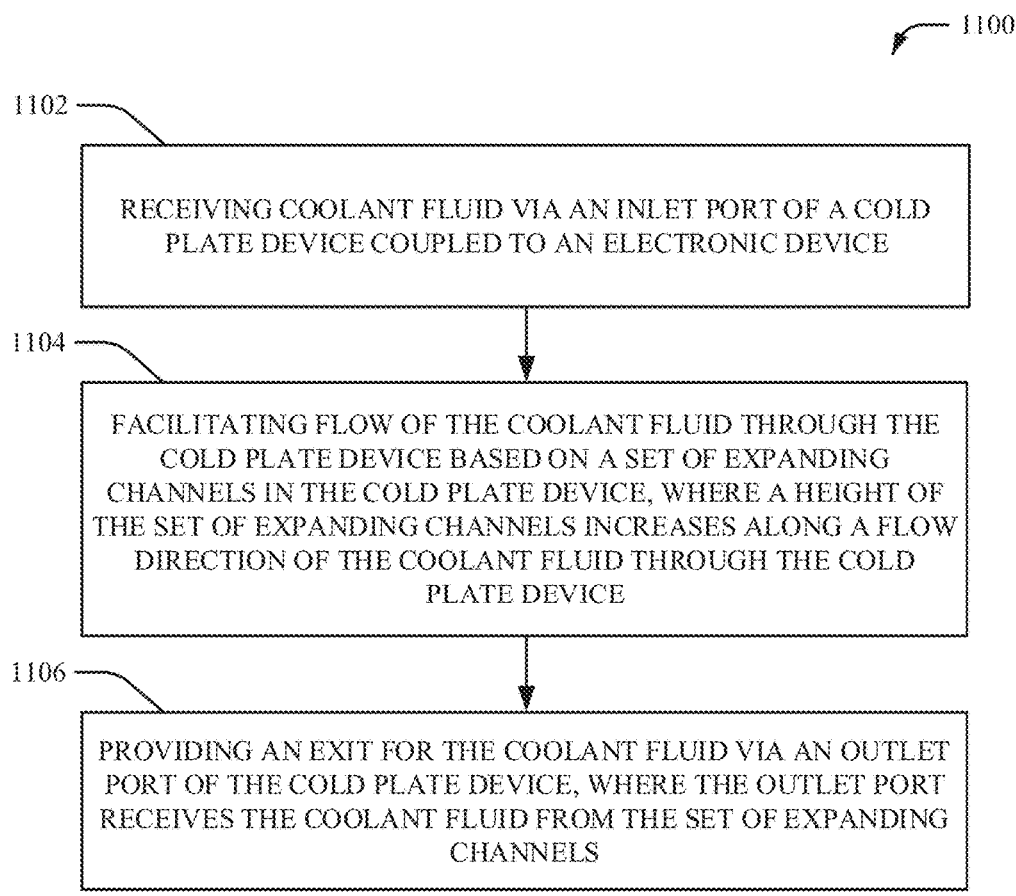
FIG. 11 illustrates a flow diagram of an example, non-limiting method that facilitates two-phase cooling of an electronic device in accordance with one or more embodiments described herein.

FIG. 11 illustrates a flow diagram of an example, non-limiting method 1100 that facilitates two-phase cooling of an electronic device in accordance with one or more embodiments described herein. Repetitive description of like elements employed in other embodiments described herein is omitted for sake of brevity.

At 1102, coolant fluid is received via an inlet port of a cold plate device (e.g., cold plate device 102, cold plate device 102', cold plate device 102", cold plate device 900 or cold plate device 1002) coupled to an electronic device. The coolant fluid can be a liquid coolant. For example, the coolant fluid can be a liquid dielectric coolant such as, but not limited to, water, a refrigerant or another type of liquid dielectric coolant. The cold plate device can comprise a set of stackable layers. A stackable layer from the set of stackable layers can be a solid material layer (e.g., a metal layer or a ceramic layer) that includes one or more through-hole regions, one or more patterned through-hole regions and/or one or more auxiliary channels. Furthermore, the cold plate device can facilitate cooling (e.g., two-phase cooling) of the electronic device coupled to the cold plate device. The inlet port of the cold plate device can be an opening of the cold plate device that receives the coolant fluid. In an aspect, the coolant fluid can be provided to the cold plate device (e.g., the inlet port of the cold plate device) via a two-phase liquid cooling system. For example, the two-phase liquid cooling system can be a pumped two-phase cooling loop that provides the coolant fluid to the cold plate device (e.g., the inlet port of the cold plate device).

At 1104, flow of the coolant fluid through the cold plate device (e.g., cold plate device 102, cold plate device 102', cold plate device 102", cold plate device 900 or cold plate device 1002) is facilitated based on a set of expanding channels in the cold plate device, where a height of the set of expanding channels increases along a flow direction of the coolant fluid through the cold plate device. The inlet port of the cold plate device can provide the coolant fluid to the set of expanding channels. Furthermore, through-hole regions, patterned through-hole regions and/or one or more auxiliary channels of the set of stackable layers can form the set of expanding channels. The set of expanding channels (e.g., the increase of the height of the set of expanding channels along the flow direction of the coolant fluid through the cold plate device) can allow two-phase flow of the coolant fluid to expand in a vertical direction with respect to the cold plate device. In an aspect, the coolant fluid (e.g., the liquid coolant) that flows through the cold plate device via the set of expanding channels can be transformed into a liquid-vapor mixture (e.g., a two-phase mixture) as the liquid coolant flows through the set of expanding channels. In another aspect, the coolant fluid can be employed by the cold plate device to reduce a temperature of the electronic device coupled to the cold plate device and/or to offset heat generated by the electronic device coupled to the cold plate device.

At 1106, an exit for the coolant fluid is provided via an outlet port of the cold plate device (e.g., cold plate device 102, cold plate device 102', cold plate device 102", cold plate device 900 or cold plate device 1002), where the outlet port receives the coolant fluid from the set of expanding channels. For example, the outlet port can receive the coolant fluid as liquid coolant (e.g., in a liquid state) from the set of expanding channels. In another example, the outlet port can receive the coolant fluid as a liquid-vapor mixture (e.g., in a liquid-vapor state) from the set of expanding channels. In an aspect, the coolant fluid that exits the outlet port of the cold plate device can be pumped back into the cold plate device (e.g., the inlet port of the cold plate device) via the pumped two-phase cooling loop associated with the cold plate device.

Figure 12:
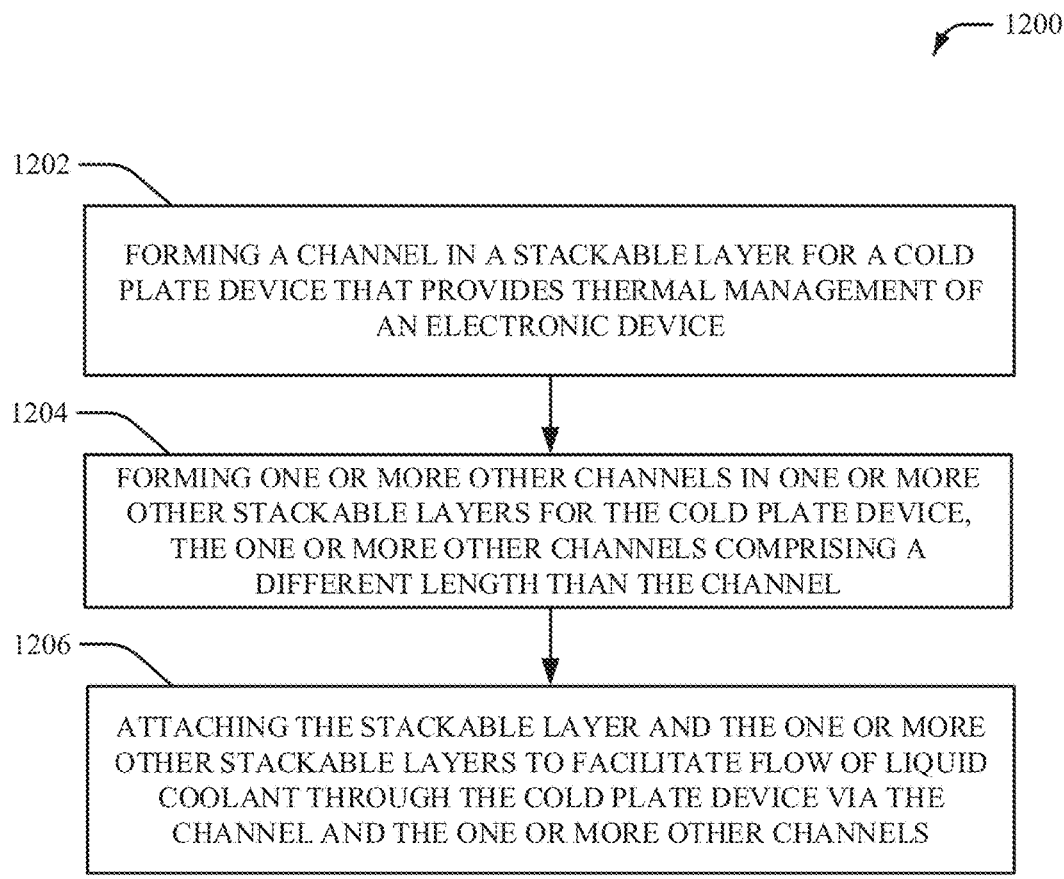
FIG. 12 illustrates a flow diagram of an example, non-limiting method that facilitates fabrication of a cold plate device with a set of expanding channels in accordance with one or more embodiments described herein.

FIG. 12 illustrates a flow diagram of an example, non-limiting method 1200 that facilitates fabrication of a cold plate device with a set of expanding channels in accordance with one or more embodiments described herein. At 1202, a channel is formed in a stackable layer (e.g., first stackable layer 106) for a cold plate device that provides thermal management of an electronic device. The stackable layer can comprise metal such as copper, aluminum or another type of alloy. Alternatively, the stackable layer can comprise a ceramic material (e.g., aluminum nitride, etc.). In one example, the channel can be formed in the stackable layer via an etching process (e.g., a chemical etching process). In another example, the channel can be formed in the stackable layer via a machining fabrication process. In yet another example, the channel can be formed in the stackable layer via a punching fabrication process (e.g., a punching metal forming process). In an aspect, the channel can be associated with a set of wall structures). The set of wall structures can be raised structures that are formed within an area associated with the channel. For example, a height of a wall structure from the set of wall structures can correspond to a depth of the channel formed in the stackable layer. Furthermore, the set of wall structures can be surrounded by the channel.

At 1204, one or more other channels are formed in one or more other stackable layers (e.g., one or more other stackable layers $90_{2_1-N}$) for the cold plate device, the one or more other channels comprising a different length than the channel. The one or more other stackable layers can comprise metal such as copper, aluminum or another type of alloy. Additionally or alternatively, the one or more other stackable layers can comprise a ceramic material (e.g., aluminum nitride, etc.). In one example, the one or more other channels can be formed in the one or more other stackable layers via an etching process (e.g., a chemical etching process). In another example, the one or more other channels can be formed in the one or more other stackable layers layer via a machining fabrication process. In yet another example, the one or more other channels can be formed in the one or more other stackable layers via a punching fabrication process (e.g., a punching metal forming process). In an aspect, the one or more other channels can be one or more through-hole regions, one or more patterned through-hole regions and/or one or more auxiliary channels.

At 1206, the stackable layer and the one or more other stackable layers are attached to facilitate flow of liquid coolant through the cold plate device (e.g., cold plate device 102) via the channel and the one or more other channels. For example, the stackable layer and the one or more other stackable layers can be stacked to form the cold plate device. In an aspect, the stackable layer and the one or more other stackable layers can be aligned to facilitate alignment of the channel and the one or more other channels. Additionally, sintering associated with the stackable layer and the one or more other stackable layers can be performed in response to pressure applied to a set of surfaces associated with the stackable layer and the one or more other stackable layers (e.g., a top surface of the cold plate device and a bottom surface of the cold plate device). Additionally or alternatively, welding associated with the stackable layer and the one or more other stackable layers can be performed in response to pressure applied to a set of surfaces associated with the stackable layer and the one or more other stackable layers (e.g., a top surface of the cold plate device and a bottom surface of the cold plate device).

Figure 13:
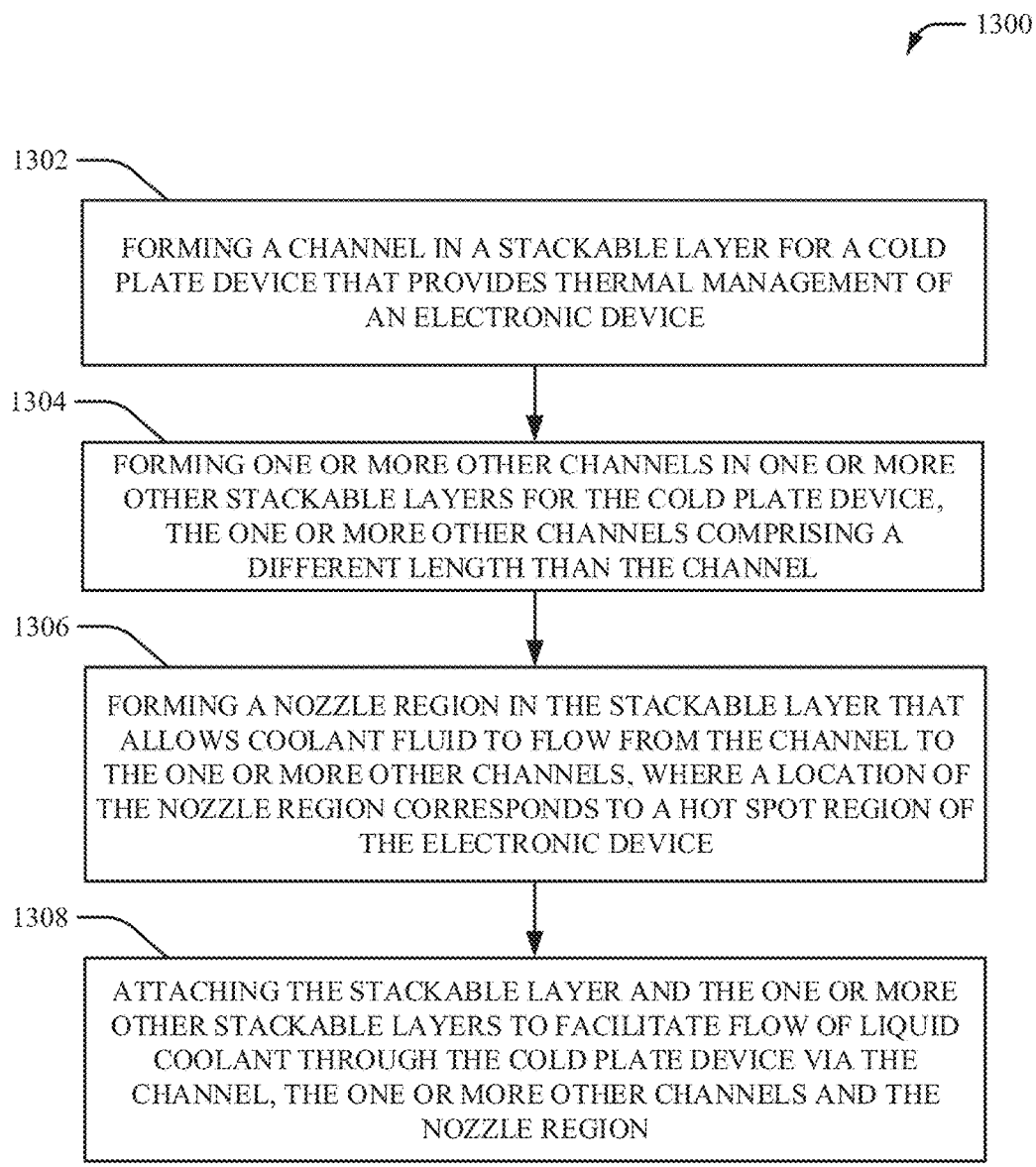
FIG. 13 illustrates a flow diagram of an example, non-limiting method that facilitates directed two-phase cooling of an electronic device in accordance with one or more embodiments described herein.

FIG. 13 illustrates a flow diagram of an example, non-limiting method 1300 that facilitates directed two-phase cooling of an electronic device in accordance with one or more embodiments described herein. At 1302, a channel is formed in a stackable layer (e.g., first stackable layer 106) for a cold plate device that provides thermal management of an electronic device. The stackable layer can comprise metal such as copper, aluminum or another type of alloy. Alternatively, the stackable layer can comprise a ceramic material (e.g., aluminum nitride, etc.). In one example, the channel can be formed in the stackable layer via an etching process (e.g., a chemical etching process). In another example, the channel can be formed in the stackable layer via a machining fabrication process. In yet another example, the channel can be formed in the stackable layer via a punching fabrication process (e.g., a punching metal forming process). In an aspect, the channel can be associated with a set of wall structures). The set of wall structures can be raised structures that are formed within an area associated with the channel. For example, a height of a wall structure from the set of wall structures can correspond to a depth of the channel formed in the stackable layer. Furthermore, the set of wall structures can be surrounded by the channel At 1304, one or more other channels are formed in one or more other stackable layers for the cold plate device, the one or more other channels (e.g., one or more other stackable layers $90_{2_1-N}$) comprising a different length than the channel The one or more other stackable layers can comprise metal such as copper, aluminum or another type of alloy. Additionally or alternatively, the one or more other stackable layers can comprise a ceramic material (e.g., aluminum nitride, etc.). In one example, the one or more other channels can be formed in the one or more other stackable layers via an etching process (e.g., a chemical etching process). In another example, the one or more other channels can be formed in the one or more other stackable layers layer via a machining fabrication process. In yet another example, the one or more other channels can be formed in the one or more other stackable layers via a punching fabrication process (e.g., a punching metal forming process). In an aspect, the one or more other channels can be one or more through-hole regions, one or more patterned through-hole regions and/or one or more auxiliary channels.

At 1306, a nozzle region (e.g., nozzle region 606) is formed in the stackable layer that allows coolant fluid to flow from the channel to the one or more other channels, where a location of the nozzle region corresponds to a hot spot region of the electronic device. For example, the nozzle region can provide an opening between a channel from the one or more other channels and another channel (e.g., an auxiliary channel) from the one or more other channels. In another example, the nozzle region can be associated with an auxiliary channel of the stackable layer. As such, the nozzle region can provide an opening between a channel from the one or more other channels and the auxiliary channel. In an aspect, a location of the nozzle region can correspond to a hot spot region of the electronic device. The nozzle region can facilitate directed heat transfer (e.g., directed cooling) for the hot spot region of the electronic device 104. For instance, the nozzle region can be an opening that creates jet impingement and/or spray cooling for the hot spot region of the electronic device.

At 1308, the stackable layer and the one or more other stackable layers are attached to facilitate flow of liquid coolant through the cold plate device (e.g., cold plate device 102, cold plate device 102', cold plate device 102", cold plate device 900 or cold plate device 1002) via the channel, the one or more other channels and the nozzle region. For example, the stackable layer and the one or more other stackable layers can be stacked to form the cold plate device. In an aspect, the stackable layer and the one or more other stackable layers can be aligned to facilitate alignment of the channel and the one or more other channels. Additionally, sintering associated with the stackable layer and the one or more other stackable layers can be performed in response to pressure applied to a set of surfaces associated with the stackable layer and the one or more other stackable layers (e.g., a top surface of the cold plate device and a bottom surface of the cold plate device). Additionally or alternatively, welding associated with the stackable layer and the one or more other stackable layers can be performed in response to pressure applied to a set of surfaces associated with the stackable layer and the one or more other stackable layers (e.g., a top surface of the cold plate device and a bottom surface of the cold plate device).

Figure 14:
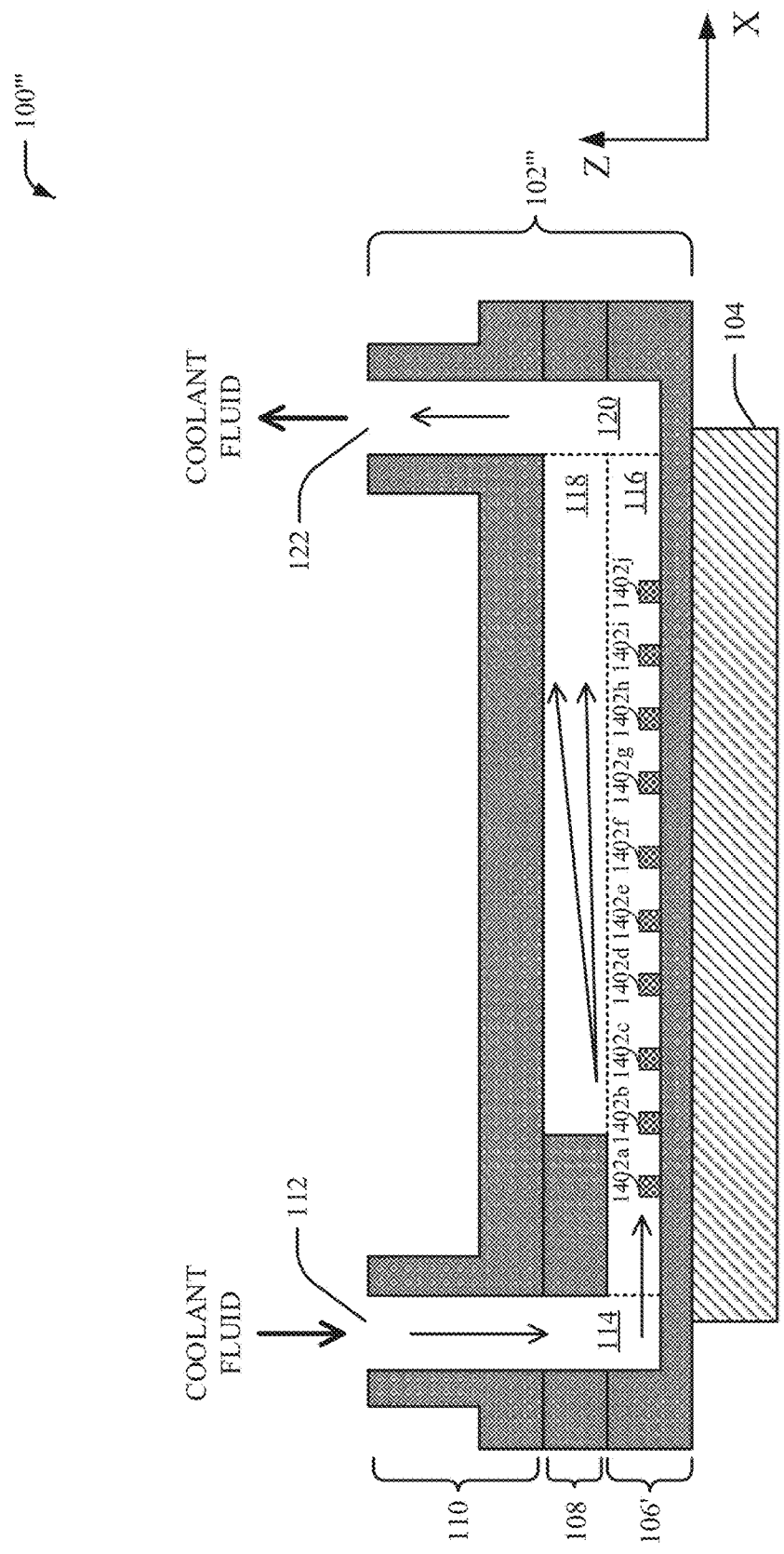
FIG. 14 illustrates a block diagram of another example, non-limiting system associated with a cold plate device and an electronic device in accordance with one or more embodiments described herein.

FIG. 14 illustrates a block diagram of an example, non-limiting system 100' in accordance with one or more embodiments described herein. The system 100''' can be an alternate embodiment of the system 100. Repetitive description of like elements employed in other embodiments described herein is omitted for sake of brevity.

The system 100''' can illustrate a side view of channel expansion in a z-x plane. In the embodiment shown in FIG. 14, the system 100''' can include a cold plate device 102''' and the electronic device 104. The cold plate device 102''' can be an alternate embodiment of the cold plate device 102. The cold plate device 102''' can include a first stackable layer 106', the second stackable layer 108 and the manifold layer 110. In an alternate embodiment, the second stackable layer 108 and the manifold layer 110 can be combined into a single stackable layer. For example, the second stackable layer 108 can include the manifold layer 110. The first stackable layer 106' can be an alternate embodiment of the first stackable layer 106. In an embodiment, the cold plate device 102''' can be formed via a 3D printing process. For example, the first stackable layer 106', the second stackable layer 108 and/or the manifold layer 110 can be 3D printed.

Additionally, in the embodiment shown in FIG. 14, the first stackable layer 106' of the cold plate device 102''' can include a set of raised step structures 1402a, 1402b, 1402c, 1402d, 1402e, 1402f, 1402g, 1402h, 1402i and 1402j. For instance, the set of raised step structures 1402a-j can be formed at a base of the first stackable layer 106'. The set of raised step structures 1402a-j can be formed in, for example, the first stackable channel 116. In an aspect, a first raised step structure (e.g., the raised step structure 1402a) can be separated from a second raised structure (e.g., the raised step structure 1402b) by a particular distance. For example, wherein there can be a defined distance between a first raised step structure (e.g., the raised step structure 1402a) and a second raised structure (e.g., the raised step structure 1402b). Furthermore, a solid material region (e.g., a solid material region of the first stackable layer') can be located between the first raised step structure (e.g., the raised step structure 1402a) and the second raised step structure (e.g., the raised step structure 1402b). In one example, the set of raised step structures 1402a-j can be raised rib structures formed as rectangular elements that at least partially block flow of the coolant fluid that flows through the cold plate device 102''' and/or facilitates mixing (e.g., turbulent mixing) of the coolant fluid within the cold plate device 102'''. For instance, the set of raised step structures 1402a-j can facilitate mixing of coolant fluid associated with a first temperature (e.g., a relatively high temperature) in the cold plate device 102''' with coolant fluid associated with a second temperature (e.g., a relatively low temperature) in the cold plate device 102'''. In one example, the set of raised step structures 1402a-j can facilitate mixing of coolant fluid (e.g., coolant fluid with a first temperature) near a solid surface of the cold plate device 102''' with coolant fluid (e.g., coolant fluid with a second temperature) in a channel bulk portion of the cold plate device 102'''. In another example, the set of raised step structures 1402a-j can facilitate mixing of coolant fluid in a liquid-phase with coolant fluid in a vapor-phase. The set of raised step structures 1402a-j can be located in a flow direction of the coolant fluid to facilitate induced turbulence in a flow field associated with the coolant fluid and/or the cold plate device 102'''. A location of the set of raised step structures 1402a-j can also corresponds to potential bubble nucleation sites associated with the cold plate device 102'''. Furthermore, the set of raised step structures 1402a-j can enhance a heat transfer rate associated with the cold plate device 102'''. For example, the set of raised step structures 1402a-j can enhance a rate of heat transfer across a fluid-solid interface within the cold plate device 102'''. The set of raised step structures 1402a-j can also facilitate reduction in a temperature of the electronic device 104 coupled to the cold plate device 102''' and/or improved energy efficiency of a two-phase cooling system that provides the coolant fluid to the cold plate device'''. It is to be appreciated that the number of raised step structures 1402a-j shown in FIG. 14 is merely an example. Therefore, the cold plate device 102''' can include a greater number of raised step structures 1402a-j or a lesser number of raised step structures 1402a-j. In an embodiment, two or more raised step structures of the set of raised step structures 1402a-j can comprise a corresponding height. In another example, at least one raised step structure of the set of raised step structures 1402a-j can comprise a different height than at least one other raised step structure of the set of raised step structures 1402a-j. In certain embodiments, a height of the set of raised step structures 1402a-j can be implemented in a descending order of height from the inlet port 112 to the outlet port 122. In a non-limiting example, a height of the raised step structure 1402a can be approximately 40% of a height of the first stackable channel 116, and height of the set of raised step structures 1402a-j can decrease at a constant rate such that a height of the raised step structure 1402j can be approximately 5% of a height of the first stackable channel 116.

Figure 15:
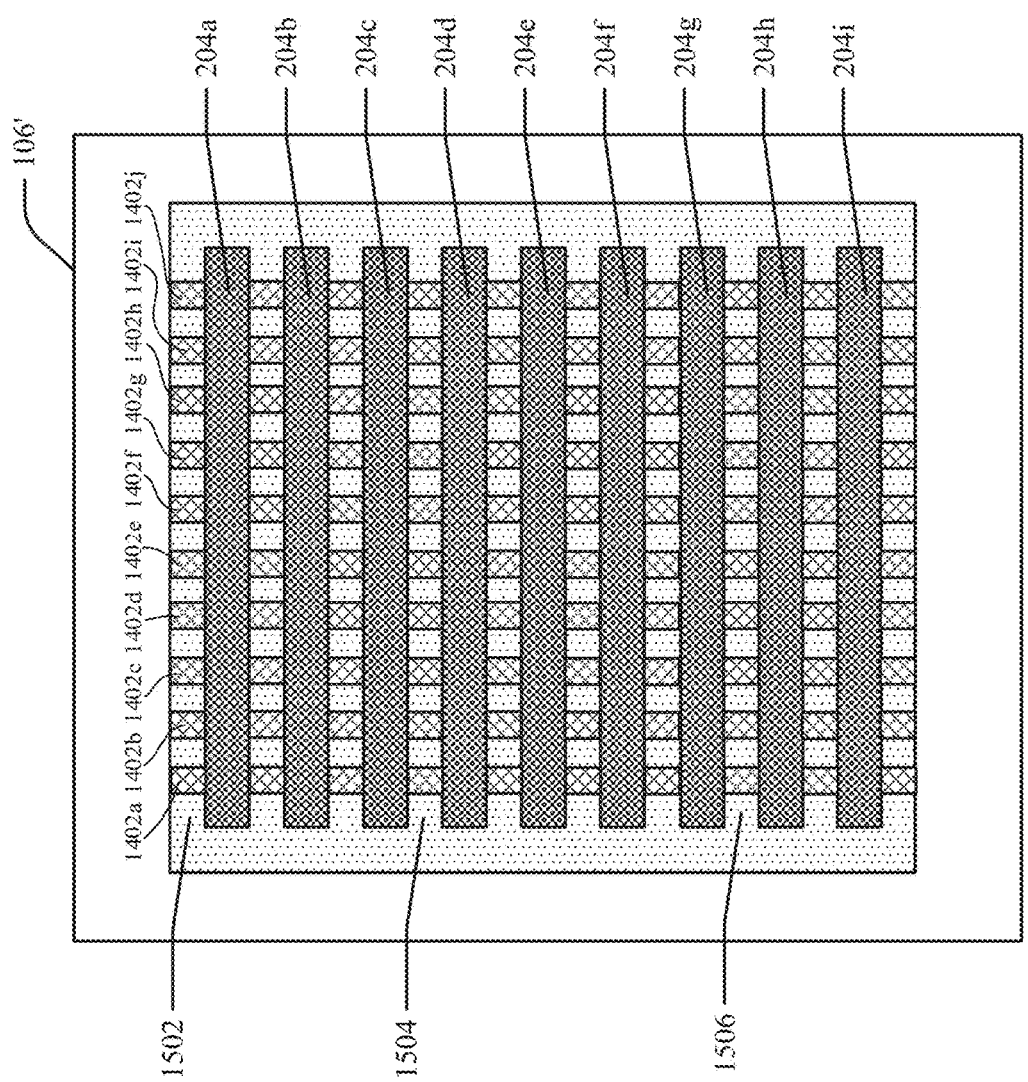
FIG. 15 illustrates another example, non-limiting stackable layer in accordance with one or more embodiments described herein.

FIG. 15 illustrates a top view of an example, non-limiting first stackable layer 106' in accordance with one or more embodiments described herein. The first stackable layer 106' can be an alternate embodiment of the first stackable layer 106. Repetitive description of like elements employed in other embodiments described herein is omitted for sake of brevity.

The first stackable layer 106' can be, for example, a base plate layer of the cold plate device 102'''. In the embodiment shown in FIG. 15, the first stackable layer 106' can include a channel 1502, the set of wall structures 204a-i and the set of raised step structures 1402a-j. The first stackable layer 106' can comprise metal such as copper, aluminum or another type of alloy. Alternatively, the first stackable layer 106' can comprise a ceramic material (e.g., aluminum nitride, etc.). The first stackable channel 116 can be associated with the channel 1502. For example, at least a portion of the channel 1502 can comprise the first stackable channel 116. The set of raised step structures 1402a-j can comprise metal such as copper, aluminum or another type of alloy. Alternatively, the set of raised step structures 1402a-j can comprise a ceramic material (e.g., aluminum nitride, etc.). The first stackable layer 106' can also include other channels and/or raised step structures. For example, a channel 1504 can also be associated with raised step structures, the channel 1506 can also be associated with raised step structures, etc.

Figure 16:
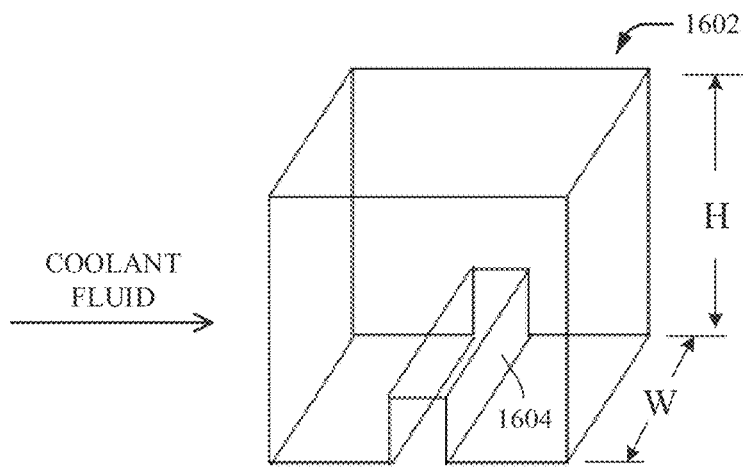
FIG. 16 illustrates an example, non-limiting channel with a raised step structure in accordance with one or more embodiments described herein.

FIG. 16 illustrates an example, non-limiting portion of a channel 1602 in accordance with one or more embodiments described herein. The channel 1602 can correspond to, for example, the first stackable channel 116, the channel 1502, etc. Repetitive description of like elements employed in other embodiments described herein is omitted for sake of brevity.

The channel 1602 can include a raised step structure 1604. A height of the raised step structure 1604 can be less than a height H of the channel 1602. For instance, a height of the raised step structure 1604 can be a fraction (e.g., 15%, 20%, 30%, etc.) of the height H of the channel 1602. A width of the raised step structure 1604 can be equal to a width W of the channel 1602. For instance, a width of the raised step structure 1604 can correspond to a portion of the raised step structure 1604 that receives flow of the coolant fluid.

Figure 17:
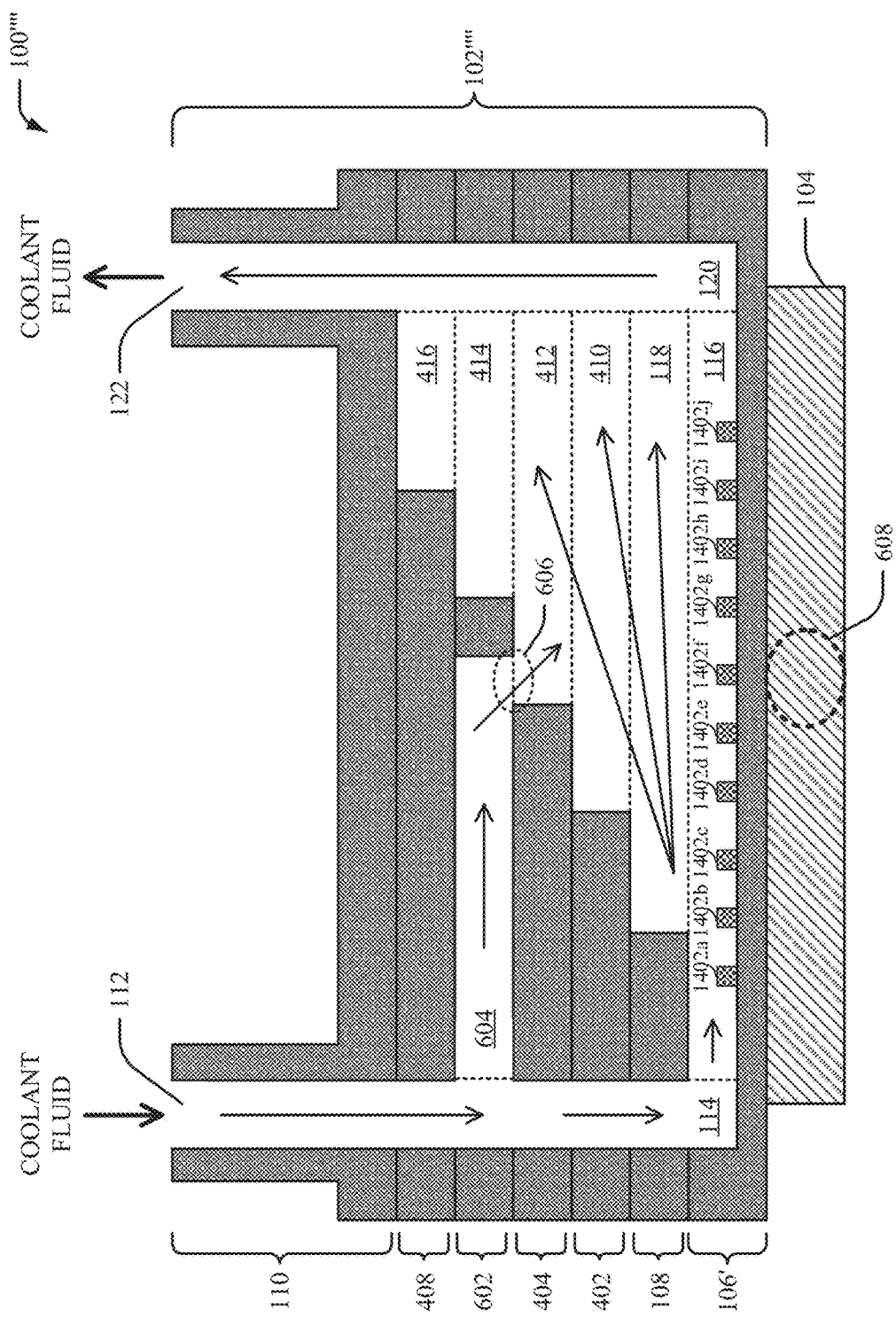
FIG. 17 illustrates a block diagram of another example, non-limiting system associated with a cold plate device and an electronic device in accordance with one or more embodiments described herein.

FIG. 17 illustrates a block diagram of an example, non-limiting system 100' in accordance with one or more embodiments described herein. The system 100"" can be an alternate embodiment of the system 100"'. Repetitive description of like elements employed in other embodiments described herein is omitted for sake of brevity.

In the embodiment shown in FIG. 17, the system 100"" can include a cold plate device 102"" and the electronic device 104. The cold plate device 102"" can be an alternate embodiment of the cold plate device 102"'. The cold plate device 102"" can include the first stackable layer 106', the second stackable layer 108, the third stackable layer 402, the fourth stackable layer 404, the fifth stackable layer 602, the sixth stackable layer 408 and the manifold layer 110. In an alternate embodiment, the sixth stackable layer 408 and the manifold layer 110 can be combined into a single stackable layer. For example, the sixth stackable layer 408 can include the manifold layer 110. In an embodiment, the cold plate device 102"" can be formed via a 3D printing process. For example, the first stackable layer 106', the second stackable layer 108, the third stackable layer 402, the fourth stackable layer 404, the fifth stackable layer 602, the sixth stackable layer 408 and/or the manifold layer 110 can be 3D printed. Additionally, in the embodiment shown in FIG. 17, the first stackable layer 106' of the cold plate device 102"" can include the set of raised step structures 1402a-j. In an aspect, at least a portion of the set of raised step structures 1402a-j can correspond to the hot spot region 608. In certain embodiments a greater number of raised step structures (e.g., a higher concentration of raised step structures) from the set of raised step structures 1402a-j can be located approximate to the hot spot region 608 than other regions of the electronic device 104.

FIGS. 18A-E illustrate example, non-limiting channels associated with raised step structures in accordance with one or more embodiments described herein. Repetitive description of like elements employed in other embodiments described herein is omitted for sake of brevity.

Figure 18A:
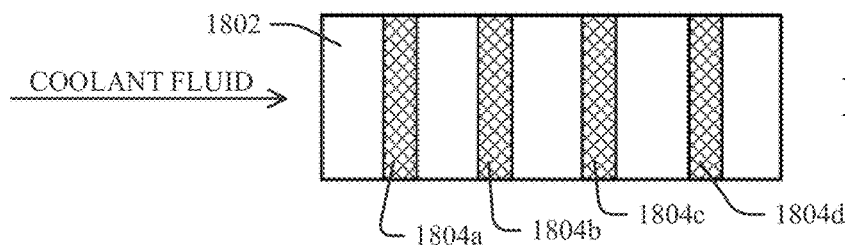
FIGS. 18A-E illustrate example, non-limiting channels associated with raised step structures in accordance with one or more embodiments described herein.

FIG. 18A illustrates a channel 1802 that includes a raised step structure 1804a, a raised step structure 1804b, a raised step structure 1804c and a raised step structure 1804d. As shown in FIG. 18A, an orientation of the raised step structures 1804a-d can be perpendicular to flow of coolant fluid through the channel 1802.

Figure 18B:
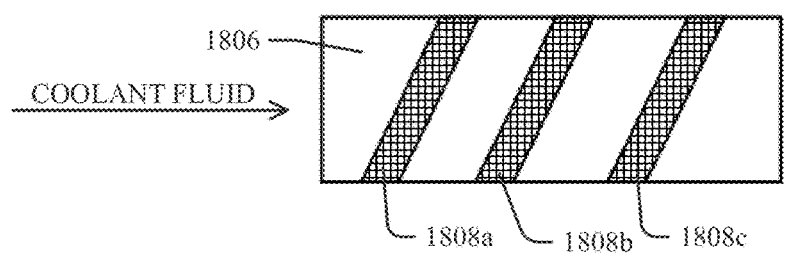

FIG. 18B illustrates a channel 1806 that includes a raised step structure 1808a, a raised step structure 1808b and a raised step structure 1808c. As shown in FIG. 18B, an orientation of the raised step structures 1808a-c can be rotated (e.g., rotated clockwise) relative to flow of coolant fluid through the channel 1806.

Figure 18C:
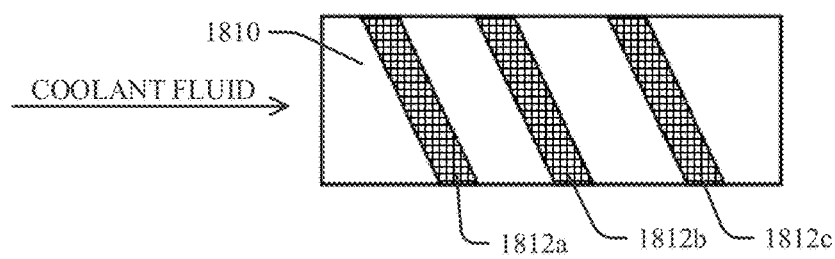

FIG. 18C illustrates a channel 1810 that includes a raised step structure 1812a, a raised step structure 1812b and a raised step structure 1812c. As shown in FIG. 18C, an orientation of the raised step structures 1812a-c can be rotated (e.g., rotated counterclockwise) relative to flow of coolant fluid through the channel 1810.

Figure 18D:
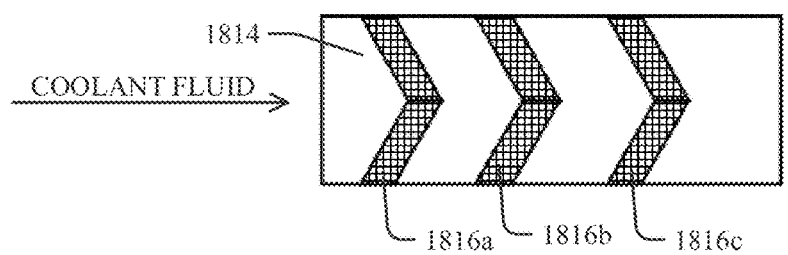

FIG. 18D illustrates a channel 1814 that includes a raised step structure 1816a, a raised step structure 1816b and a raised step structure 1816c. As shown in FIG. 18D, an orientation of the raised step structures 1816a-c can be angled relative to flow of coolant fluid through the channel 1814 (e.g., angled inwards along flow of coolant fluid through the channel 1814).

Figure 18E:
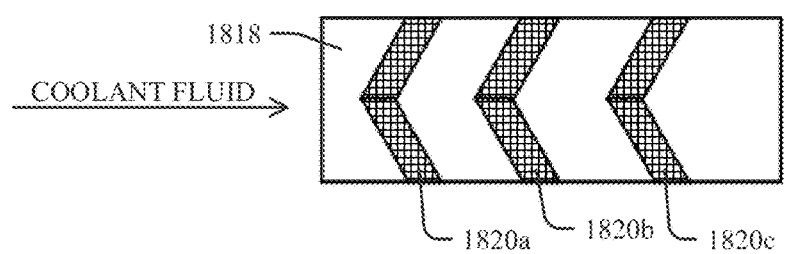

FIG. 18E illustrates a channel 1818 that includes a raised step structure 1820a, a raised step structure 1820b and a raised step structure 1820c. As shown in FIG. 18E, an orientation of the raised step structures 1820a-c can be angled relative to flow of coolant fluid through the channel 1818 (e.g., angled inwards against flow of coolant fluid through the channel 1818).

Figure 19:
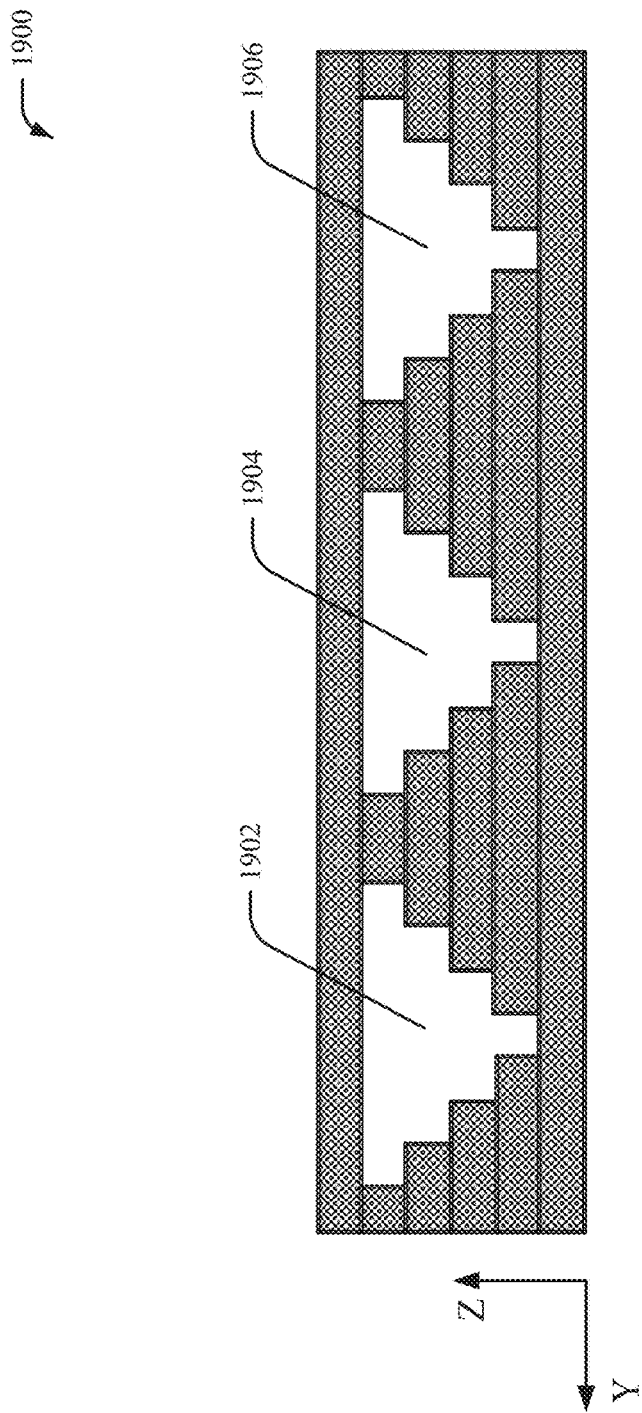
FIG. 19 illustrates an example, non-limiting cross-sectional view of a cold plate device in accordance with one or more embodiments described herein.

FIG. 19 illustrates a block diagram of an example, non-limiting cross-sectional view of a cold plate device 1900 in accordance with one or more embodiments described herein. The cold plate device 1900 can correspond to, for example, at least a portion of the cold plate device 102, the cold plate device 102', the cold plate device 102", the cold plate device 102"', or the cold plate device 102"". Repetitive description of like elements employed in other embodiments described herein is omitted for sake of brevity.

The cross-sectional view of the cold plate device 1900 can illustrate channel expansion in the in the y-z plane. The cold plate device 1900 can include a first set of channels 1902, a second set of channels 1904 and a third set of channels 1906. Coolant fluid can flow through the first set of channels 1902, the second set of channels 1904 and the third set of channels 1906. In the embodiment shown in FIG. 19, a width of the first set of channels 1902, the second set of channels 1904 and the third set of channels 1906 can increase along the z-direction.

Figure 20:
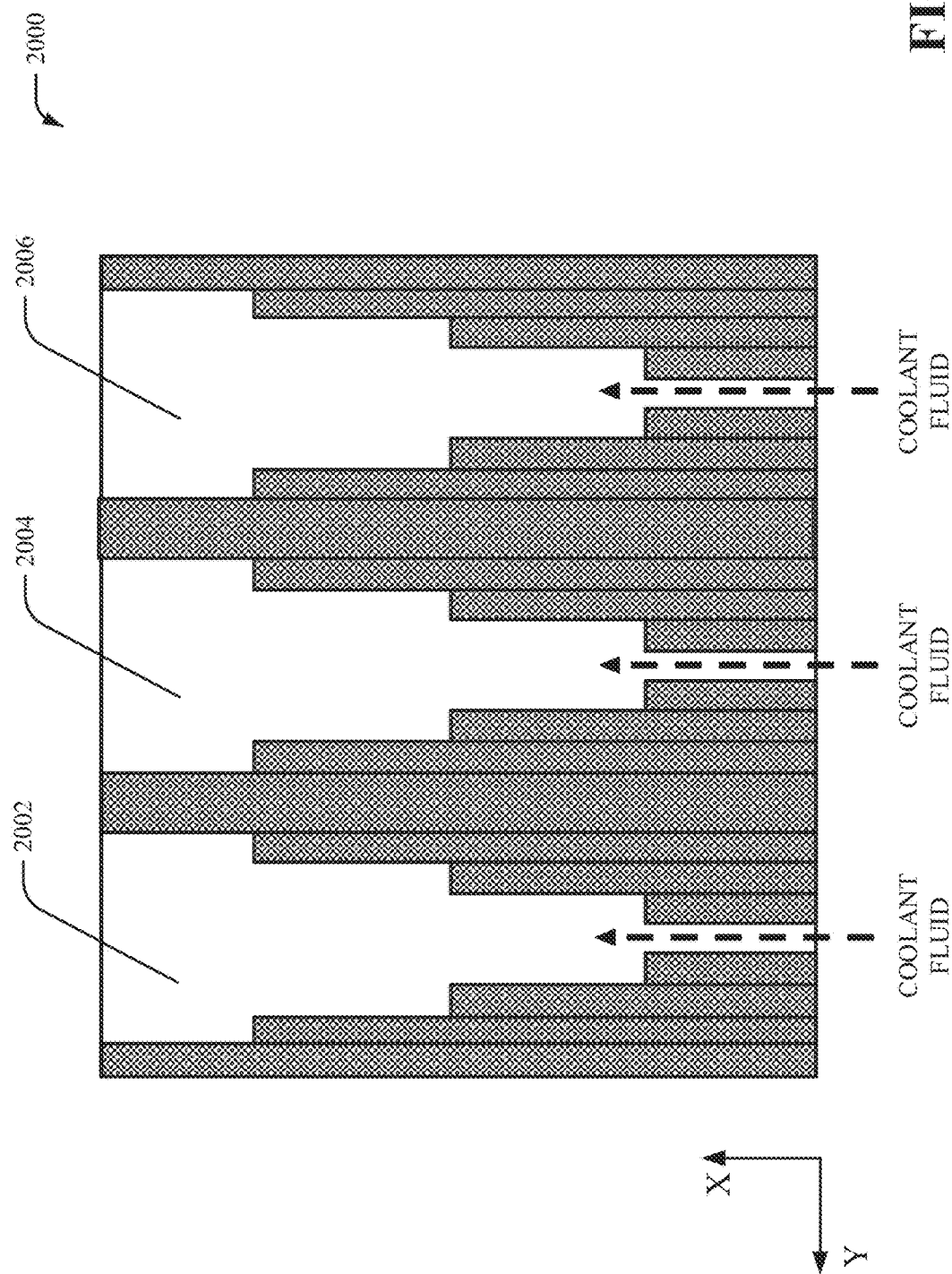
FIG. 20 illustrates an example, non-limiting expansion view of a cold plate device in accordance with one or more embodiments described herein.

FIG. 20 illustrates a block diagram of an example, non-limiting top view of a cold plate device 2000 in accordance with one or more embodiments described herein. The cold plate device 2000 can correspond to, for example, at least a portion of the cold plate device 102, the cold plate device 102', the cold plate device 102", the cold plate device 102"', or the cold plate device 102"". Repetitive description of like elements employed in other embodiments described herein is omitted for sake of brevity.

The top view of the cold plate device 2000 can illustrate channel expansion in the in the x-y plane. The cold plate device 2000 can include a first set of channels 2002, a second set of channels 2004 and a third set of channels 2006. Coolant fluid can flow through the first set of channels 2002, the second set of channels 2004 and the third set of channels 2006. In the embodiment shown in FIG. 20, a width of the first set of channels 2002, the second set of channels 2004 and the third set of channels 2006 can increase along the y-direction. For instance, a width of the first set of channels 2002, the second set of channels 2004 and the third set of channels 2006 can increase along a flow direction of the coolant fluid through the cold plate device 2000.

Figure 21:
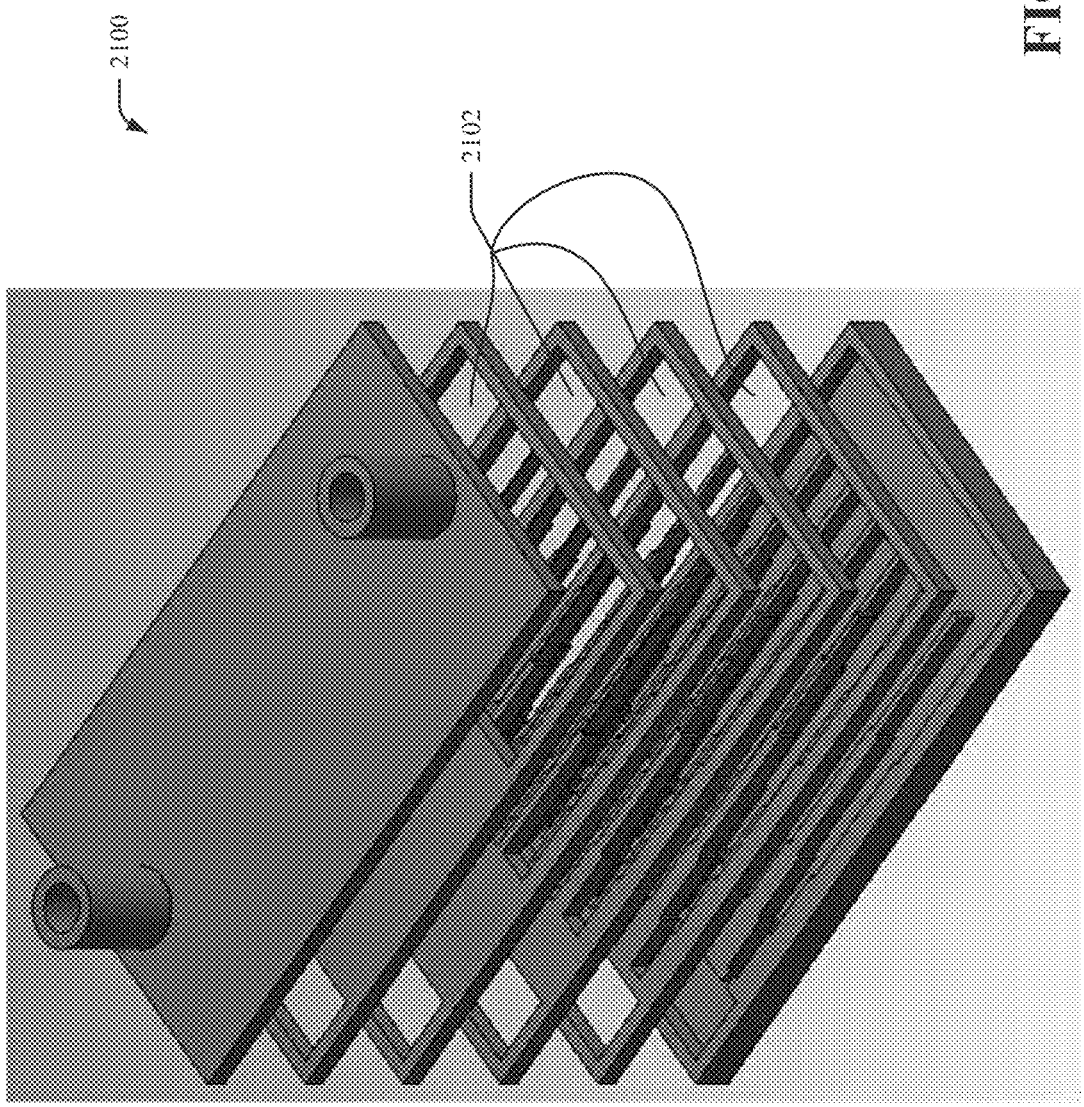
FIG. 21 illustrates an example, non-limiting exploded isometric view of a cold plate device in accordance with one or more embodiments described herein.

FIG. 21 illustrates a block diagram of an example, non-limiting exploded isometric view of a cold plate device 2100 in accordance with one or more embodiments described herein. The cold plate device 2100 can correspond to, for example, the cold plate device 102, the cold plate device 102', the cold plate device 102", the cold plate device 102"', the cold plate device 102"", or the cold plate device 2000. Repetitive description of like elements employed in other embodiments described herein is omitted for sake of brevity.

In the embodiment shown in FIG. 21, the cold plate device 2100 can include a set of expanding channels 2102. A height of the set of expanding channels 2102 and a width of the set of expanding channels 2102 can increase along a flow direction of coolant fluid that can flow through the cold plate device 2100. In an embodiment, the cold plate device 2100 can be formed via a 3D printing process. For example, stackable layers of the cold plate device 2100 and/or the set of expanding channels associated with stackable layer of the cold plate device 2100 can be 3D printed.

Figure 22:
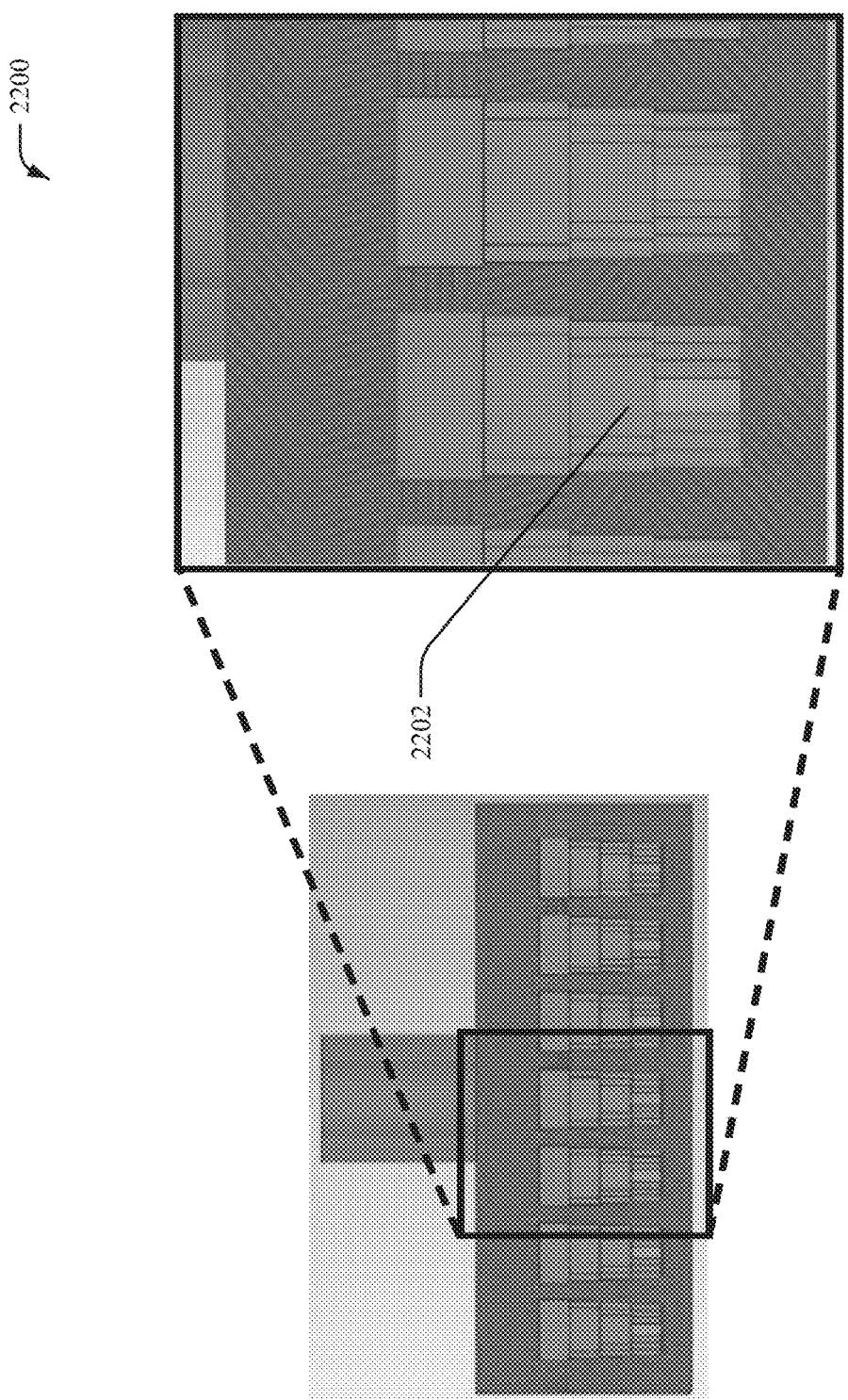
FIG. 22 illustrates an example, non-limiting cutaway view of a cold plate device in accordance with one or more embodiments described herein.

FIG. 22 illustrates a block diagram of an example, non-limiting cutaway view of a cold plate device 2200 in accordance with one or more embodiments described herein. The cold plate device 2200 can correspond to, for example, at least a portion of the cold plate device 102, the cold plate device 102', the cold plate device 102'', the cold plate device 102''', the cold plate device 102'''', the cold plate device 2000 or the cold plate device 2100. Repetitive description of like elements employed in other embodiments described herein is omitted for sake of brevity.

The cold plate device 2200 can include at least a set of channels 2202. In the embodiment shown in FIG. 22, a width of the set of channels 2202 can increase along a flow direction of the coolant fluid through the cold plate device 2200.

Figure 23:
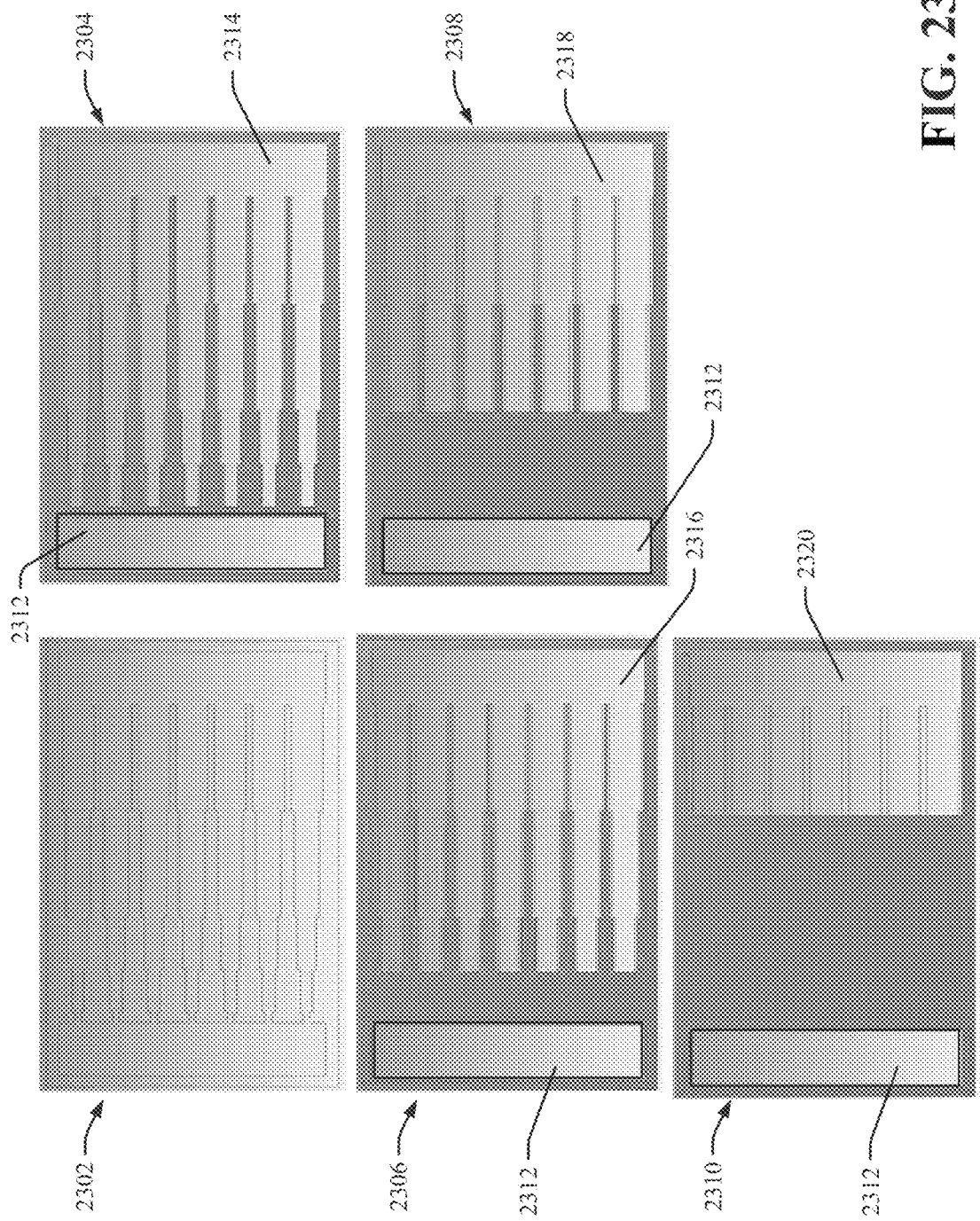
FIG. 23 illustrates an example, non-limiting stackable layers of a cold plate device in accordance with one or more embodiments described herein.

FIG. 23 illustrates a block diagram of an example, non-limiting cutaway view of stackable layers of a cold plate device in accordance with one or more embodiments described herein. Repetitive description of like elements employed in other embodiments described herein is omitted for sake of brevity.

In the embodiment shown in FIG. 23, a first stackable layer 2302, a second stackable layer 2304, a third stackable layer 2306, a fourth stackable layer 2308 and a fifth stackable layer 2310 can be provided. For example, the first stackable layer 2302 can correspond to the first stackable layer 106 or the first stackable layer 106'. Furthermore, the second stackable layer 2304 can correspond to the second stackable layer 108, the third stackable layer 2306 can correspond to the third stackable layer 402, the fourth stackable layer 2308 can correspond to the fourth stackable layer 404, and the fifth stackable layer 2310 can correspond to the fifth stackable layer 406, for example. The first stackable layer 2302, the second stackable layer 2304, the third stackable layer 2306, the fourth stackable layer 2308 and/or the fifth stackable layer 2310 can comprise metal such as copper, aluminum or another type of alloy. Additionally or alternatively, the first stackable layer 2302, the second stackable layer 2304, the third stackable layer 2306, the fourth stackable layer 2308 and/or the fifth stackable layer 2310 can comprise a ceramic material (e.g., aluminum nitride, etc.).

The first stackable layer 2302 can be a bottom layer of a cold plate device that does not include a through-hole region or a patterned through-hole region. In certain embodiments, the first stackable layer 2302 can include a set of raised step structures. The second stackable layer 2304 can include a through-hole region 2312 and a patterned through-hole region 2314. The third stackable layer 2306 can include the through-hole region 2312 and a patterned through-hole region 2316. The fourth stackable layer 2308 can include the through-hole region 2312 and a patterned through-hole region 2318. The fifth stackable layer 2310 can include the through-hole region 2312 and a patterned through-hole region 2320.

The through-hole region 2312 can be a hole through the second stackable layer 2304, the third stackable layer 2306, the fourth stackable layer 2308 and the fifth stackable layer 2310. In one example, the through-hole region 2312 can be a rectangular shape or a square shape. However, it is to be appreciated that the through-hole region 2312 can comprise a different shape such as a circular shape, another type of shape, etc. The patterned through-hole region 2314 can be a hole through the second stackable layer 2304, the patterned through-hole region 2316 can be a hole through the third stackable layer 2306, the patterned through-hole region 2318 can be a hole through the fourth stackable layer 2308, and the patterned through-hole region 2320 can be a hole through the fifth stackable layer 2310. A shape of the patterned through-hole region 2314, the patterned through-hole region 2316, the patterned through-hole region 2318 and the patterned through-hole region 2320 can be associated with a set of expanding channels. For instance, at least the first stackable layer 2302, the second stackable layer 2304, the third stackable layer 2306, the fourth stackable layer 2308 and the fifth stackable layer 2310 can be stacked to form a cold plate device that includes a set of expanding channels. A height and a width of the set of expanding channels associated with the patterned through-hole region 2314, the patterned through-hole region 2316, the patterned through-hole region 2318 and the patterned through-hole region 2320 can increase along a flow direction of coolant fluid through a cold plate device formed by at least the first stackable layer 2302, the second stackable layer 2304, the third stackable layer 2306, the fourth stackable layer 2308 and the fifth stackable layer 2310.

Figure 24:
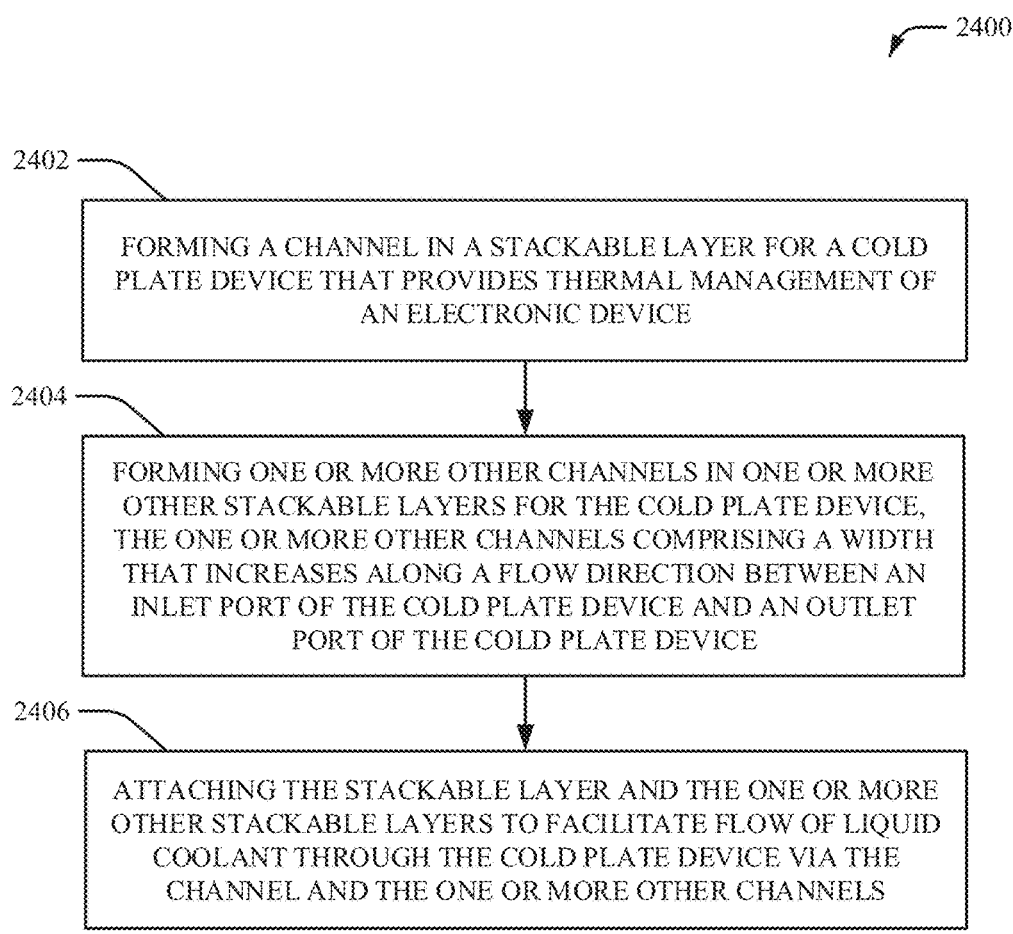
FIG. 24 illustrates a flow diagram of another example, non-limiting method that facilitates fabrication of a cold plate device with a set of expanding channels in accordance with one or more embodiments described herein.

FIG. 24 illustrates a flow diagram of an example, non-limiting method 2400 that facilitates fabrication of a cold plate device with a set of expanding channels in accordance with one or more embodiments described herein. At 2402, a channel is formed in a stackable layer (e.g., first stackable layer 106 or first stackable layer 106') for a cold plate device that provides thermal management of an electronic device. The stackable layer can comprise metal such as copper, aluminum or another type of alloy. Alternatively, the stackable layer can comprise a ceramic material (e.g., aluminum nitride, etc.). In one example, the channel can be formed in the stackable layer via an etching process (e.g., a chemical etching process). In another example, the channel can be formed in the stackable layer via a machining fabrication process. In yet another example, the channel can be formed in the stackable layer via a punching fabrication process (e.g., a punching metal forming process). In an aspect, the channel can be associated with a set of wall structures). The set of wall structures can be raised structures that are formed within an area associated with the channel For example, a height of a wall structure from the set of wall structures can correspond to a depth of the channel formed in the stackable layer. Furthermore, the set of wall structures can be surrounded by the channel In certain embodiments, the stackable layer can include a set of raised step structures. For instance, a bottom surface of the channel formed in the stackable layer can include a set of raised step structures.

At 2404, one or more other channels are formed in one or more other stackable layers (e.g., one or more other stackable layers $902_{1-N}$, second stackable layer 2304, third stackable layer 2306, fourth stackable layer 2308, fifth stackable layer 2310, etc.) for the cold plate device, the one or more other channels comprising a width that increases along a flow direction between an inlet port of the cold plate device and an outlet port of the cold plate device. The one or more other stackable layers can comprise metal such as copper, aluminum or another type of alloy. Additionally or alternatively, the one or more other stackable layers can comprise a ceramic material (e.g., aluminum nitride, etc.). In one example, the one or more other channels can be formed in the one or more other stackable layers via an etching process (e.g., a chemical etching process). In another example, the one or more other channels can be formed in the one or more other stackable layers layer via a machining fabrication process. In yet another example, the one or more other channels can be formed in the one or more other stackable layers via a punching fabrication process (e.g., a punching metal forming process). In an aspect, the one or more other channels can be one or more through-hole regions, one or more patterned through-hole regions and/or one or more auxiliary channels.

At 2406, the stackable layer and the one or more other stackable layers are attached to facilitate flow of liquid coolant through the cold plate device (e.g., cold plate device 102) via the channel and the one or more other channels. For example, the stackable layer and the one or more other stackable layers can be stacked to form the cold plate device. In an aspect, the stackable layer and the one or more other stackable layers can be aligned to facilitate alignment of the channel and the one or more other channels. Additionally, sintering associated with the stackable layer and the one or more other stackable layers can be performed in response to pressure applied to a set of surfaces associated with the stackable layer and the one or more other stackable layers (e.g., a top surface of the cold plate device and a bottom surface of the cold plate device). Additionally or alternatively, welding associated with the stackable layer and the one or more other stackable layers can be performed in response to pressure applied to a set of surfaces associated with the stackable layer and the one or more other stackable layers (e.g., a top surface of the cold plate device and a bottom surface of the cold plate device).

Figure 25:
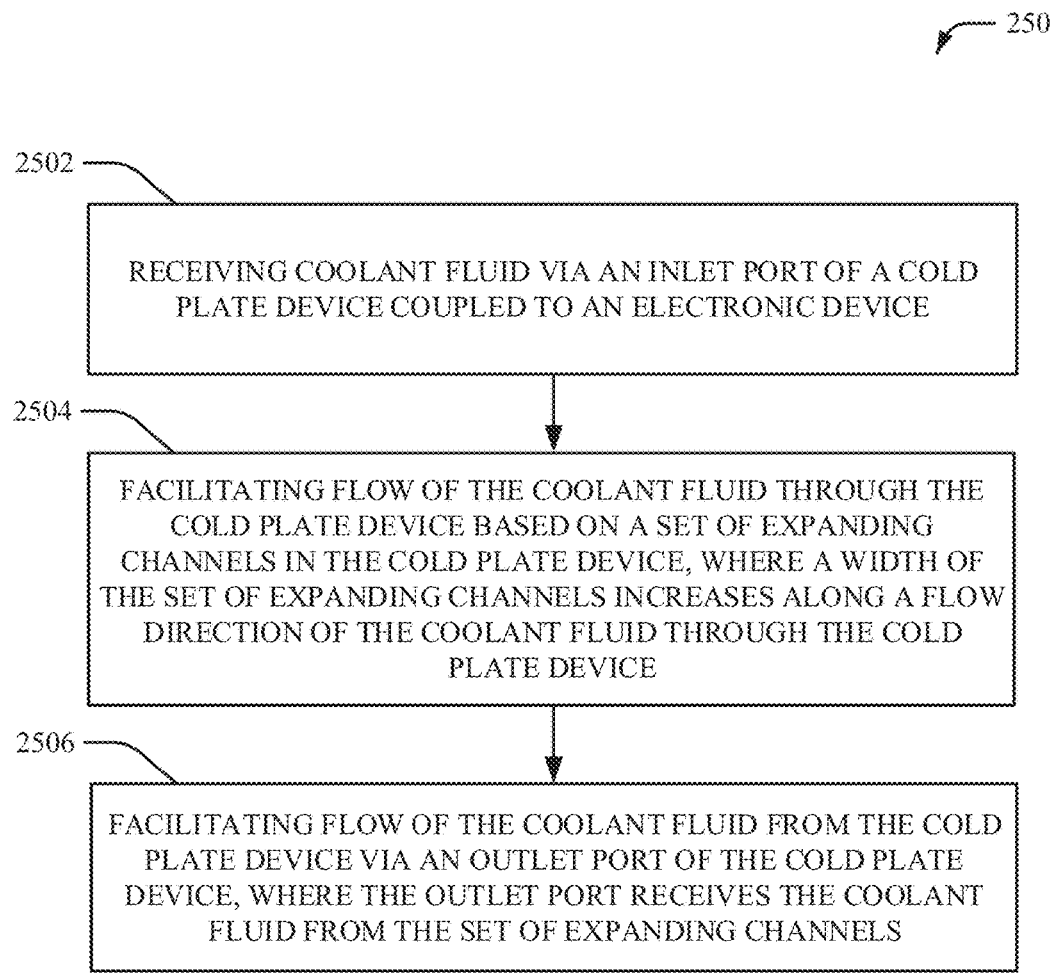
FIG. 25 illustrates a flow diagram of another example, non-limiting method that facilitates flow of coolant through a cold plate device with a set of expanding channels in accordance with one or more embodiments described herein.

FIG. 25 illustrates a flow diagram of an example, non-limiting method 2500 that facilitates flow of coolant through a cold plate device with a set of expanding channels in accordance with one or more embodiments described herein. At 2502, coolant fluid is received via an inlet port of a cold plate device (e.g., cold plate device 102''') coupled to an electronic device (e.g., electronic device 104). At 2504, flow of the coolant fluid is facilitated through the cold plate device based on a set of expanding channels (e.g., set of expanding channels 2102) in the cold plate device, where a width of the set of expanding channels increases along a flow direction of the coolant fluid through the cold plate device. At 2506, flow of the coolant fluid from the cold plate device is facilitated via an outlet port of the cold plate device, where the outlet port receives the coolant fluid from the set of expanding channels. In certain embodiments, the set of expanding channels can include a set of raised step structures. For instance, a bottom surface of a first channel (e.g., a bottom channel) from the set of expanding channels can include a set of raised step structures.

For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies in accordance with the disclosed subject matter. In addition, those skilled in the art will understand and appreciate that the methodologies could alternatively be represented as a series of interrelated states via a state diagram or events. The flowchart and block diagrams in the Figures illustrate the architecture, functionality, and operation of possible implementations of systems, methods, apparatuses and devices according to various embodiments of the present invention. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "electronic device" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, an electronic device and/or a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, electronic devices and/or processors can exploit nano-scale architectures such as, but not limited to, molecular and quantum-dot based transistors, switches and gates, in order to optimize space usage or enhance performance of user equipment. An electronic device and/or a processor can also be implemented as a combination of computing processing units.

What has been described above include mere examples of systems and methods. It is, of course, not possible to describe every conceivable combination of components or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
   a first stackable layer that comprises a first channel formed within the first stackable layer, wherein the first channel comprises a first channel width, and wherein the first channel receives a coolant fluid via an inlet port of the apparatus; and
   a second stackable layer that comprises a second channel that provides a path for the coolant fluid to flow between the first channel and an outlet port of the apparatus, wherein a width of the second channel increases along a flow direction of the coolant fluid that flows between the inlet port and the outlet port,
      wherein the first channel and the second channel form a set of expanding channels for the apparatus, and wherein a height of the set of expanding channels and a width of the set of expanding channels increases along a flow direction of the coolant fluid through the apparatus.

2. The apparatus of claim 1, wherein the second channel comprises a first channel height that is different than a second channel height of the first channel.

3. The apparatus of claim 1, wherein the first channel comprises a plurality of raised step structures.

4. The apparatus of claim 3, wherein a height of a raised step structure from the plurality of raised step structures is less than another height of the first channel.

5. The apparatus of claim 3, wherein an orientation of the plurality of raised step structures is perpendicular to a flow direction of the coolant fluid through the apparatus.

6. The apparatus of claim 3, wherein an orientation of the plurality of raised step structures is angled relative to a flow direction of the coolant fluid through the apparatus.

7. The apparatus of claim 3, wherein the apparatus is coupled to an electronic device.

8. The apparatus of claim 7, wherein a location of at least a portion of the plurality of raised step structures corresponds to a region of the electronic device that satisfies a defined criterion.

9. The apparatus of claim 1, wherein the first channel comprises a first raised structure, wherein there is a defined distance between the first raised structure and a second raised structure, and wherein a solid material region is located between the first raised structure and the second raised structure.

10. The apparatus of claim 1, wherein the second channel is a patterned through-hole region of the second stackable layer.

11. The apparatus of claim 1, wherein the path is a first path, and wherein the second stackable layer comprises a through-hole region that provides a second path for the coolant fluid to flow between the inlet port and the first channel.

* * * * *